United States Patent
Seki et al.

(10) Patent No.: US 10,559,620 B2
(45) Date of Patent: Feb. 11, 2020

(54) SOLID-STATE IMAGING DEVICE WITH PHASE DIFFERENCE DETECTION PIXEL AND MANUFACTURING METHOD OF THE SAME, AND ELECTRONIC APPARATUS

(71) Applicant: Sony Corporation, Tokyo (JP)

(72) Inventors: Yuichi Seki, Kumamoto (JP); Toshinori Inoue, Kumamoto (JP); Yukihiro Sayama, Kumamoto (JP); Yuka Nakamoto, Kumamoto (JP)

(73) Assignee: Sony Corporation, Tokyo (JP)

( * ) Notice: Subject to any disclaimer, the term of this patent is extended or adjusted under 35 U.S.C. 154(b) by 261 days.

(21) Appl. No.: 15/169,992

(22) Filed: Jun. 1, 2016

(65) Prior Publication Data

US 2016/0276398 A1    Sep. 22, 2016

Related U.S. Application Data

(63) Continuation of application No. 14/567,080, filed on Dec. 11, 2014, now Pat. No. 9,425,230.

(30) Foreign Application Priority Data

Dec. 18, 2013  (JP) ................................. 2013-260785
Mar. 28, 2014  (JP) ................................. 2014-067809

(51) Int. Cl.
*H01L 27/146*    (2006.01)
*H04N 5/341*    (2011.01)

(52) U.S. Cl.
CPC .... *H01L 27/14645* (2013.01); *H01L 27/1462* (2013.01); *H01L 27/14621* (2013.01); *H01L 27/14623* (2013.01); *H01L 27/14627* (2013.01); *H01L 27/14636* (2013.01); *H01L 27/14685* (2013.01); *H04N 5/341* (2013.01)

(58) Field of Classification Search
CPC ......... H01L 27/14627; H01L 27/14621; H01L 27/14623; H01L 27/1462; H01L 27/14645; H01L 27/14685; H01L 27/14636
See application file for complete search history.

(56) References Cited

U.S. PATENT DOCUMENTS

| | | | | |
|---|---|---|---|---|
| 8,988,576 B2* | 3/2015 | Itou | ..................... | H04N 5/23212 |
| | | | | 250/208.1 |
| 9,165,962 B2* | 10/2015 | Tanida | .............. | H01L 27/14623 |
| 2008/0150059 A1* | 6/2008 | Yun | ................... | H01L 27/14621 |
| | | | | 257/432 |
| 2009/0035887 A1* | 2/2009 | Suzuki | ................ | H01L 27/1462 |
| | | | | 438/57 |
| 2009/0246415 A1* | 10/2009 | Horie | ...................... | G02B 1/11 |
| | | | | 428/1.3 |

(Continued)

*Primary Examiner* — Kevin Parendo
(74) *Attorney, Agent, or Firm* — Sheridan Ross P.C.

(57) ABSTRACT

There is provided a solid-state imaging device including: an imaging pixel including a photoelectric conversion unit which receives incident light; and a phase difference detection pixel including the photoelectric conversion unit and a light shielding unit which shields some of the light incident to the photoelectric conversion unit, in which the imaging pixel further includes a high refractive index film which is formed on the upper side of the photoelectric conversion unit, and the phase difference detection pixel further includes a low refractive index film which is formed on the upper side of the photoelectric conversion unit.

13 Claims, 32 Drawing Sheets

(56) References Cited

U.S. PATENT DOCUMENTS

| | | | |
|---|---|---|---|
| 2010/0245638 A1* | 9/2010 | Ota | H01L 27/14621 348/280 |
| 2013/0015545 A1* | 1/2013 | Toumiya | H01L 27/14605 257/432 |
| 2013/0161774 A1* | 6/2013 | Okigawa | G02B 3/0056 257/432 |
| 2015/0187948 A1* | 7/2015 | Misaki | H01L 29/41733 257/43 |

* cited by examiner

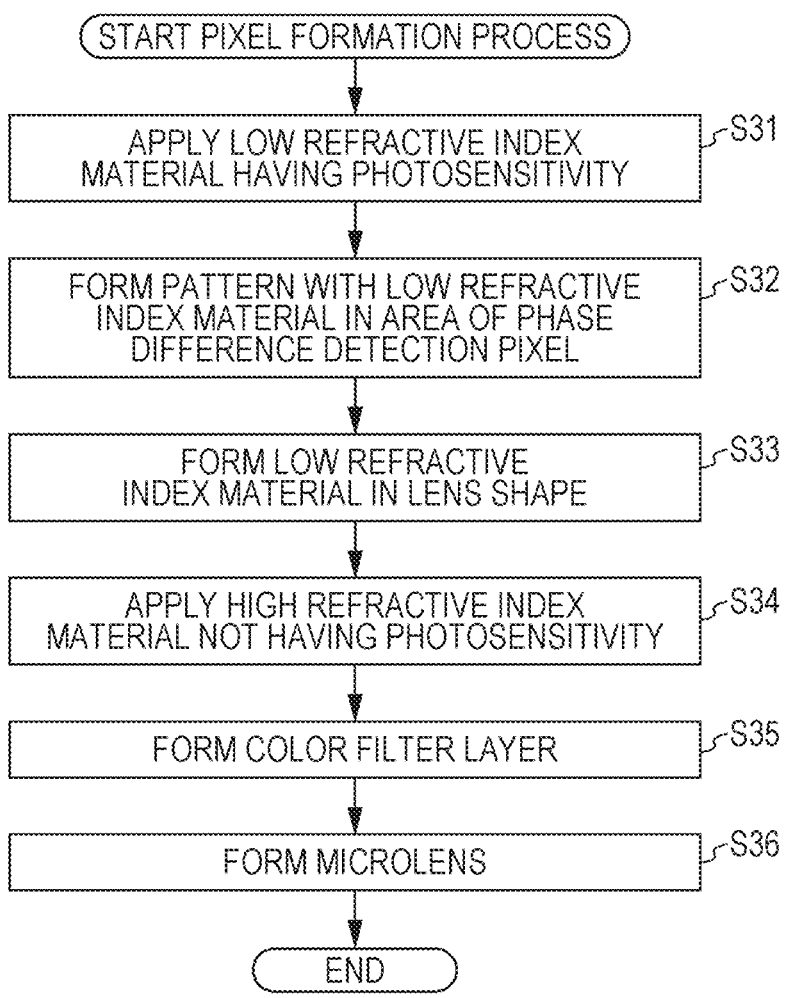

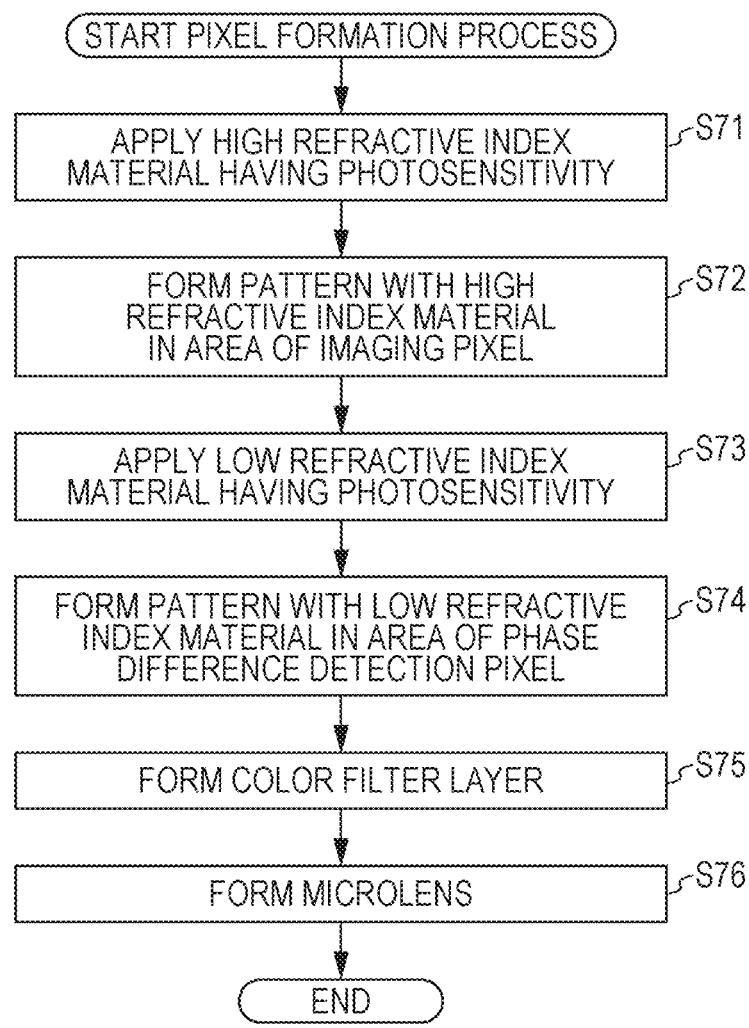

SOLID-STATE IMAGING DEVICE WITH PHASE DIFFERENCE DETECTION PIXEL AND MANUFACTURING METHOD OF THE SAME, AND ELECTRONIC APPARATUS

CROSS REFERENCE TO RELATED APPLICATIONS

This application is a continuation of U.S. patent application Ser. No. 14/567,080, filed Dec. 11, 2014, which claims the benefit of Japanese Patent Application No. JP 2013-260785, filed Dec. 18, 2013, and Japanese Patent Application No. JP 2014-067809, filed Mar. 28, 2014, the entire disclosures of which are hereby incorporated herein by reference.

BACKGROUND

The present technology relates to a solid-state imaging device and a manufacturing method of the same, and an electronic apparatus, and particularly relates to a solid-state imaging device and a manufacturing method of the same, and an electronic apparatus which can optimize sensitivity of an imaging pixel and AF performance of a phase difference detection pixel.

In the related art, regarding the solid-state imaging device, various technologies have been proposed, in order to realize improvement of sensitivity or prevention of color mixture.

For example, a solid-state imaging device in which a lens layer of which a portion corresponding to the center of a light receiving surface is formed with a refractive index distribution lower than that of a portion corresponding to a periphery of the light receiving surface, is formed as a diverging lens which allows a light condensing point of an incident light from an on-chip lens to approach the light receiving surface, in each pixel, has been proposed (for example, see Japanese Unexamined Patent Application Publication No. 2011-210981). Therefore, it is possible to shorten a distance between the on-chip lens and the light receiving surface, and to realize improvement of sensitivity or prevention of color mixture.

However, in the related art, in a digital single lens reflex camera (DSLR), since focusing is performed by a sensor which is provided separately from a solid-state imaging device which captures an image, the number of components increases or focusing is performed in a position different from a position where focusing is actually desired, and thus an error may occur regarding the focusing position.

Meanwhile, in recent years, there has been known a solid-state imaging device which provides phase difference detection pixels with imaging pixels in a pixel array unit, and detects focusing based on a shift amount of signals output by the pair of phase difference detection pixels, that is, performs focus detection by an image plane phase difference auto focus (AF) system. In the pair of phase difference detection pixels, a half of each light receiving surface different from one another is shielded by a light shielding film.

SUMMARY

In the solid-state imaging device described above, when a condensing point of a microlens is on a light receiving surface of a photoelectric conversion unit which is a lower layer than a light shielding film, sensitivity of an imaging pixel becomes maximum, whereas, when a condensing point of a microlens is on a light shielding film, AF performance of a phase difference detection pixel becomes maximum.

However, when optimizing the sensitivity of the imaging pixel, the sensitivity of the phase difference detection pixel may decrease, and particularly when a subject is dark, it is difficult to accurately perform focusing.

It is desirable to optimize sensitivity of an imaging pixel and AF performance of a phase difference detection pixel.

According to an embodiment of the present technology, there is provided a solid-state imaging device including: an imaging pixel including a photoelectric conversion unit which receives incident light; and a phase difference detection pixel including the photoelectric conversion unit and a light shielding unit which shields some of the light incident to the photoelectric conversion unit, in which the imaging pixel further includes a high refractive index film which is formed on the upper side of the photoelectric conversion unit, and the phase difference detection pixel further includes a low refractive index film which is formed on the upper side of the photoelectric conversion unit.

In the embodiment, the imaging pixel and the phase difference detection pixel may include color filter layers which are respectively formed on upper layers of the high refractive index film and the low refractive index film, and the high refractive index film and the low refractive index film may function as a flattening film.

In the embodiment, the low refractive index film may be formed to cover the high refractive index film and function as the flattening film.

In the embodiment, the high refractive index film may be formed to cover the low refractive index film and function as the flattening film.

In the embodiment, a refractive index of the high refractive index film may be higher than a refractive index of the low refractive index film, by a value equal to or greater than 0.1.

In the embodiment, the refractive index of the high refractive index film may be set as a value from 1.5 to 2.0.

In the embodiment, the refractive index of the low refractive index film may be set as a value from 1.1 to 1.5.

In the embodiment, any one or both of the high refractive index film and the low refractive index film may be formed of a material having a photosensitive property.

In the embodiment, the high refractive index film or the low refractive index film may be formed to have a cross-sectional shape as a shape of a convex lens.

In the embodiment, the imaging pixel and the phase difference detection pixel may include microlenses on the upper side of the color filter layers, and the microlenses may be formed in the same manner, in the imaging pixel and the phase difference detection pixel.

According to another embodiment of the present technology, there is provided a manufacturing method of a solid-state imaging device which includes an imaging pixel including a photoelectric conversion unit which receives incident light, and a phase difference detection pixel including the photoelectric conversion unit and a light shielding unit which shields some of the light incident to the photoelectric conversion unit, the method including: forming a high refractive index film on the upper side of the photoelectric conversion unit in the imaging pixel; and forming a low refractive index film on the upper side of the photoelectric conversion unit in the phase difference detection pixel.

According to still another embodiment of the present technology, there is provided an electronic apparatus including: a solid-state imaging device including an imaging pixel including a photoelectric conversion unit which receives incident light; and a phase difference detection pixel including the photoelectric conversion unit and a light shielding unit which shields some of the light incident to the photoelectric conversion unit, wherein the imaging pixel further includes a high refractive index film which is formed on the upper side of the photoelectric conversion unit, and the phase difference detection pixel further includes a low refractive index film which is formed on the upper side of the photoelectric conversion unit.

In the embodiment, the high refractive index film is formed on the upper side of the photoelectric conversion unit in the imaging pixel, and the low refractive index film is formed on the upper side of the photoelectric conversion unit in the phase difference detection pixel.

In the embodiment, it is possible to optimize sensitivity of the imaging pixel and AF performance of the phase difference detection pixel.

BRIEF DESCRIPTION OF THE DRAWINGS

FIG. 9 is a flowchart illustrating a pixel formation process;

FIG. 16 is a flowchart illustrating a pixel formation process;

DETAILED DESCRIPTION OF EMBODIMENTS

Hereinafter, embodiments of the present technology will be described with the drawings.

Configuration Example of Solid-State Imaging Device

Figure 1:
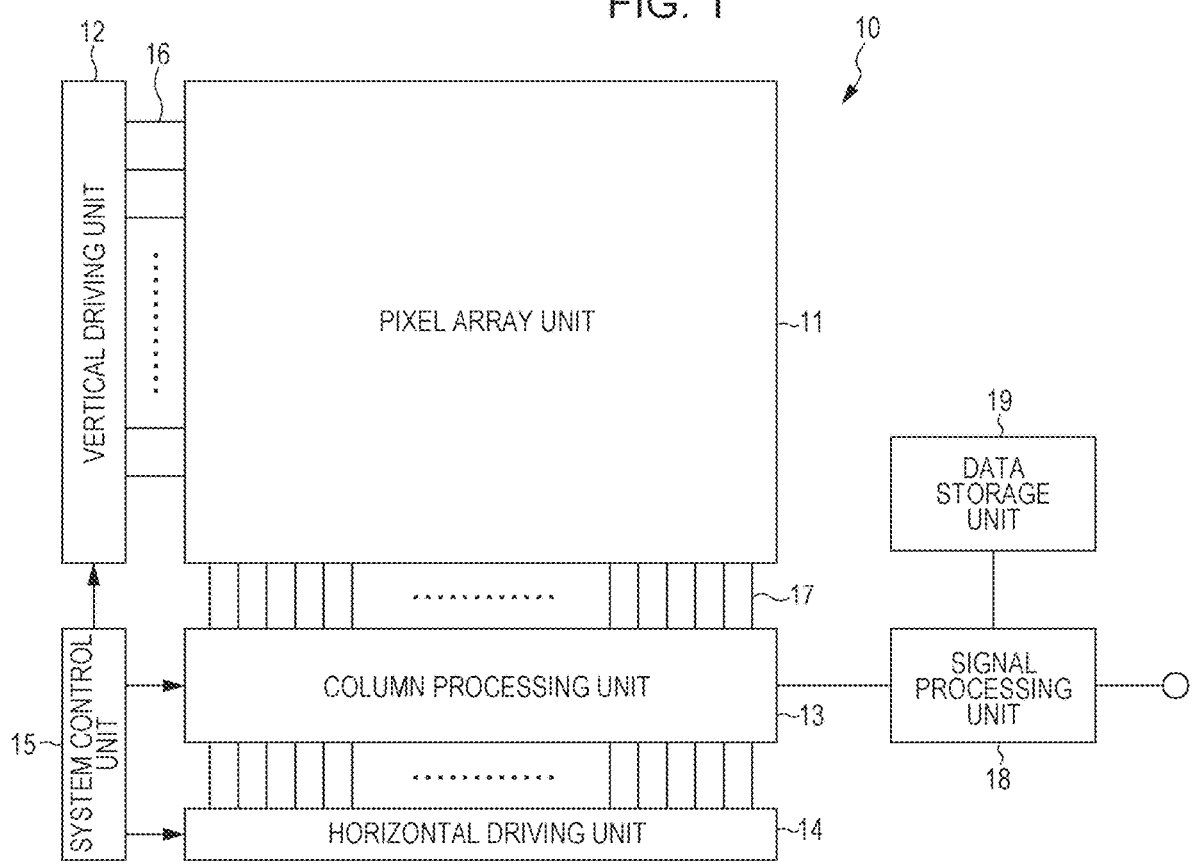
FIG. 1 is a block diagram showing a configuration example of a solid-state imaging device to which the present technology is applied.

FIG. 1 is a block diagram showing one embodiment of a solid-state imaging device to which the present technology is applied. Hereinafter, a configuration of a surface irradiation type complementary metal oxide semiconductor (CMOS) image sensor which is an amplification type solid-state imaging device will be described. The present technology is not limited to be applied to the surface irradiation type CMOS image sensor, but can also be applied to the rear surface irradiation type CMOS image sensor, another amplification type solid-state imaging device, or a charge transfer type solid-state imaging device such as a charge coupled device (CCD) image sensor.

A CMOS image sensor 10 shown in FIG. 1 includes a pixel array unit 11 which is formed on a semiconductor substrate (not shown), and a peripheral circuit unit which is integrated on the semiconductor substrate in the same manner as the pixel array unit 11. The peripheral circuit unit is, for example, configured with a vertical driving unit 12, a column processing unit 13, a horizontal driving unit 14, and a system control unit 15.

The CMOS image sensor 10 further includes a signal processing unit 18 and a data storage unit 19.

The pixel array unit 11 has a configuration in that unit pixels (hereinafter, also simply referred to as pixels) including a photoelectric conversion unit which generates and stores photoelectric charges according to received light intensity, are arranged in a row direction and a column direction, that is, two-dimensionally in a matrix. Herein, the row direction indicates an arrangement direction of pixels in a pixel row (horizontal direction), and the column direction indicates an arrangement direction of pixels in a pixel column (vertical direction). In the pixel array unit 11, pixels (imaging pixels) for generating a signal for generating a captured image based on received subject light, and pixels (phase difference detection pixels) for generating a signal for performing focus detection are arranged as a plurality of pixels.

In the pixel array unit 11, a pixel driving line 16 is wired along the row direction for each pixel row, and a vertical signal line 17 is arranged along the column direction for each pixel column, with respect to a pixel arrangement in a matrix. The pixel driving line 16 transmits a driving signal for performing driving when reading out a signal from a pixel. In FIG. 1, the pixel driving line 16 is shown as one wire, but is not limited to one wire. One end of the pixel driving line 16 is connected to an output end corresponding to each row of the vertical driving unit 12.

The vertical driving unit 12 is configured with a shift register or an address decoder, and drives the entirety of pixels of the pixel array unit 11 at the same time, or each pixel thereof in a line unit. That is, the vertical driving unit 12 configures a driving unit which drives each pixel of the pixel array unit 11, with a system control unit 15 which controls the vertical driving unit 12. The specific configuration of the vertical driving unit 12 is omitted in the drawing, but the vertical driving unit is generally configured to have two scanning systems of a read-out scanning system and a sweep-out scanning system.

The read-out scanning system sequentially selects and scans the unit pixel of the pixel array unit 11 in the row unit, in order to read out a signal from the unit pixel. The signal read out from the unit pixel is an analog signal. The sweep-out scanning system performs sweep-out scanning prior to read-out scanning by the time of a shutter speed, with respect to a read-out row where the read-out scanning is performed by the read-out scanning system.

The unnecessary charges are swept out from the photoelectric conversion unit of the unit pixel in the read-out row by performing the sweep-out scanning by the sweep-out scanning system, and accordingly the photoelectric conversion unit is reset. Since the unnecessary charges are swept out (reset) by this sweep-out scanning system, an electronic shutter operation is performed. Herein, the electronic shutter operation is an operation of deleting photoelectric charges of the photoelectric conversion unit and newly starting exposure (starting storage of photoelectric charges).

The signal read out by the read-out operation by the read-out scanning system corresponds to light intensity received after the previous read-out operation or the electronic shutter operation. A time period from a read-out timing by the previous read-out operation or from a sweep-out timing by the electronic shutter operation to a read-out timing of current read-out operation, is an exposure time period of the photoelectric charges of the unit pixel.

The signal output from each unit pixel of the pixel row which is selected and scanned by the vertical driving unit 12, is input to the column processing unit 13 through each of the vertical signal line 17 for each pixel column. The column processing unit 13 performs a predetermined signal process with respect to the signal output through the vertical signal line 17 from each pixel in the selected row, for each pixel column of the pixel array unit 11, and temporarily holds the pixel signal after the signal process.

Specifically, the column processing unit 13 at least performs a noise removing process, for example, correlated couple sampling (CDS) process, as a signal process. The fixed pattern noise unique to a pixel, such as reset noise or variation of a threshold value of an amplification transistor in the pixel, is removed by the CDS process by the column processing unit 13. In addition to the noise removing process, the column processing unit 13 has an analog-digital (AD) conversion function, for example, and can also convert an analog pixel signal into a digital signal and output the digital signal.

The horizontal driving unit 14 is configured with a shift register or an address decoder, and sequentially selects the unit circuit corresponding to the pixel column of the column processing unit 13. The pixel signal subjected to the signal processing for each unit circuit by the column processing unit 13 is sequentially output by the selection scanning by the horizontal driving unit 14.

The system control unit 15 is configured with a timing generator which generates various timing signals, and performs driving control of the vertical driving unit 12, the column processing unit 13, and the horizontal driving unit 14, based on the various timing signals generated by the timing generator.

The signal processing unit 18 has at least an arithmetic processing function, and performs various signal processes such as an arithmetic process with respect to the pixel signal output from the column processing unit 13. The data storage unit 19 temporarily stores data necessary for the signal processing in the signal processing unit 18.

The signal processing unit 18 and the data storage unit 19 may be mounted on the same substrate (semiconductor substrate) as the CMOS image sensor 10, or may be disposed on the substrate different from the CMOS image sensor 10. Each process of the signal processing unit 18 and the data storage unit 19 may be executed as a process of an external signal processing unit, for example, a digital signal processor (DSP) circuit or software provided on the substrate different from the CMOS image sensor 10.

In a case where the CMOS image sensor 10 is a rear surface irradiation type CMOS image sensor, the CMOS image sensor may be configured as a laminated type CMOS image sensor obtained by bonding a semiconductor substrate including the pixel array unit 11 and a semiconductor substrate including a logic circuit to each other.

Pixel Array of Pixel Array Unit

Next, the pixel arrangement of the pixel array unit 11 will be described with reference to FIG. 2.

Figure 2:
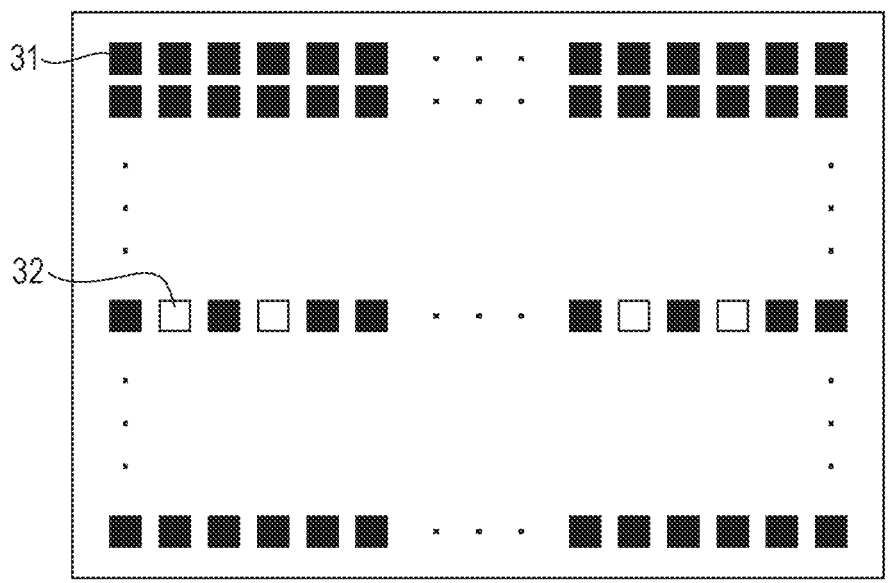
FIG. 2 is a diagram illustrating a pixel arrangement of a pixel array unit.

As shown in FIG. 2, a plurality of imaging pixels 31 shown as black squares are arranged in the pixel array unit 11 two-dimensionally in a matrix. The imaging pixels 31 are formed of R pixels, G pixels, and B pixels, and these are regularly arranged along a Bayer array.

A plurality of phase difference detection pixels 32 shown as white squares are arranged in the pixel array unit 11 to be scattered in the plurality of imaging pixels 31 arranged two-dimensionally in a matrix. Specifically, the phase difference detection pixels 32 are substituted with some of the imaging pixels 31 in one predetermined row among the pixel rows in the pixel array unit 11, and thus are regularly arranged in a specific pattern. The arrangement of the imaging pixels 31 and the phase difference detection pixels 32 in the pixel array unit 11 is not limited thereto, and the pixels may be arranged in the other pattern.

Hereinafter, the embodiment of the imaging pixels 31 and the phase difference detection pixels 32 in the pixel array unit 11 will be described.

Configuration Example of Pixels of First Embodiment

Figure 3:
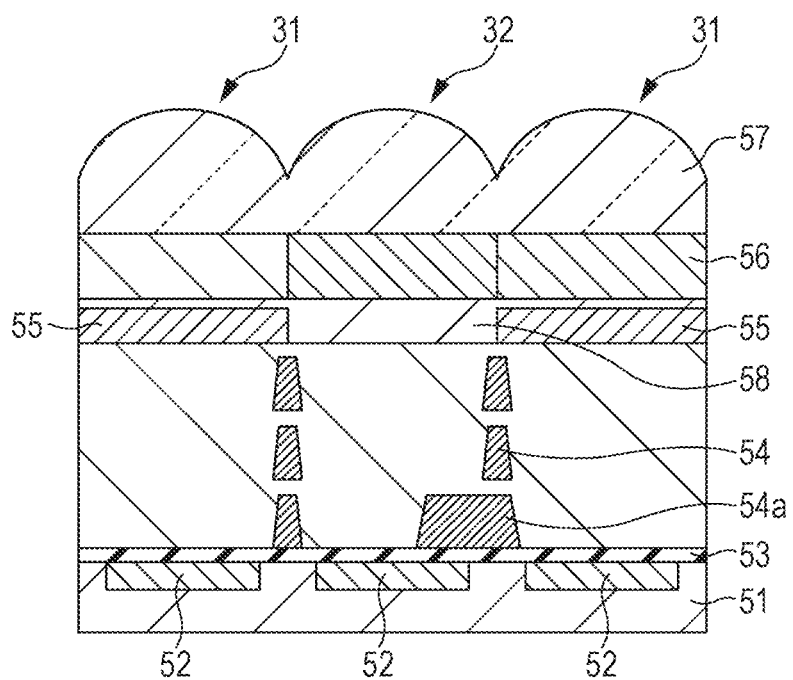
FIG. 3 is a cross-sectional view showing a configuration example of a pixel of a first embodiment of the present technology.

FIG. 3 is a cross-sectional view showing a configuration example of the pixels of the CMOS image sensor 10 according to the first embodiment. FIG. 3 shows a cross-sectional view of the imaging pixels 31 and the phase difference detection pixels 32 of the CMOS image sensor 10.

As shown in FIG. 3, in the imaging pixel 31, a photoelectric conversion unit 52 which receives incident light and performs photoelectric conversion is formed on a semiconductor substrate 51, and an insulating layer 53 formed of SiO or the like is formed on the upper layer of the semiconductor substrate 51. A plurality of wire layers 54 formed of Cu or Al are formed on the insulating layer 53.

A high refractive index film 55 formed of a high refractive index material having a photosensitive property is formed on the wire layers 54. Examples of the high refractive index material having a photosensitive property include $TiO_2$, $ZrO_2$, ZnO, and the like. A refractive index of the high refractive index film 55 is set to a value from 1.5 to 2.0. A color filter layer 56 having spectral characteristics corresponding to each of the imaging pixels 31 is formed on the high refractive index film 55, and a microlens 57 is formed on the color filter layer 56.

Meanwhile, the semiconductor substrate 51, the photoelectric conversion unit 52, the insulating layer 53, the wire layers 54, the color filter layer 56, and the microlens 57 are also formed in the phase difference detection pixel 32, in the same manner as the imaging pixel 31.

In the phase difference detection pixel 32, a part of the wire layer 54 is formed as a light shielding film 54a which shields some of the light incident to the photoelectric conversion unit 52, to have an opening having a size which is substantially half of a light receiving area of the photoelectric conversion unit 52. A low refractive index film 58 formed of a low refractive index material not having a photosensitive property is formed between the wire layer 54 and the color filter layer 56. As the low refractive index material not having a photosensitive property, hollow silica is used, for example. The low refractive index film 58 is formed so as to cover the high refractive index film 55 of the imaging pixel 31, and also functions as a flattening film when the color filter layer 56 is formed. A refractive index of the low refractive index film 58 is set to a value from 1.1 to 1.5.

In the phase difference detection pixel 32, a light attenuating filter for attenuating incident light amount to the same extent as achieved by the color filter layer 56 may be formed instead of the color filter layer 56.

In the imaging pixel 31 and the phase difference detection pixel 32, the microlenses 57 are formed in the same manner, that is, the microlenses 57 are formed in the same shape and size, and have the same light condensing point, but the specific setting thereof can be performed by adjusting a refractive index or a film thickness of the high refractive index film 55 or the low refractive index film 58.

That is, the light condensing point of the microlens 57 in the imaging pixel 31 can be set on the light receiving surface of the photoelectric conversion unit 52 by the high refractive index film 55, and the light condensing point of the microlens 57 in the phase difference detection pixel 32 can be set on the upper surface of the light shielding film 54a by the low refractive index film 58.

According to the configuration of the embodiment, since the high refractive index film 55 is provided on the upper side of the photoelectric conversion unit 52 in the imaging pixel 31 and the low refractive index film 58 is provided on the upper side of the photoelectric conversion unit 52 in the phase difference detection pixel 32, the light condensing point of the microlens 57 can be set on the light receiving surface of the photoelectric conversion unit 52 in the imaging pixel 31, and the light condensing point of the microlens 57 can be set on the upper surface of the light shielding film 54a in the phase difference detection pixel 32. That is, it is possible to optimize the sensitivity of the imaging pixel and the AF performance of the phase difference detection pixel.

Since the microlenses 57 are formed in the same manner in the imaging pixel 31 and the phase difference detection pixel 32, it is possible to easily perform a formation process of the microlens.

Flow of Pixel Formation

Figure 4:
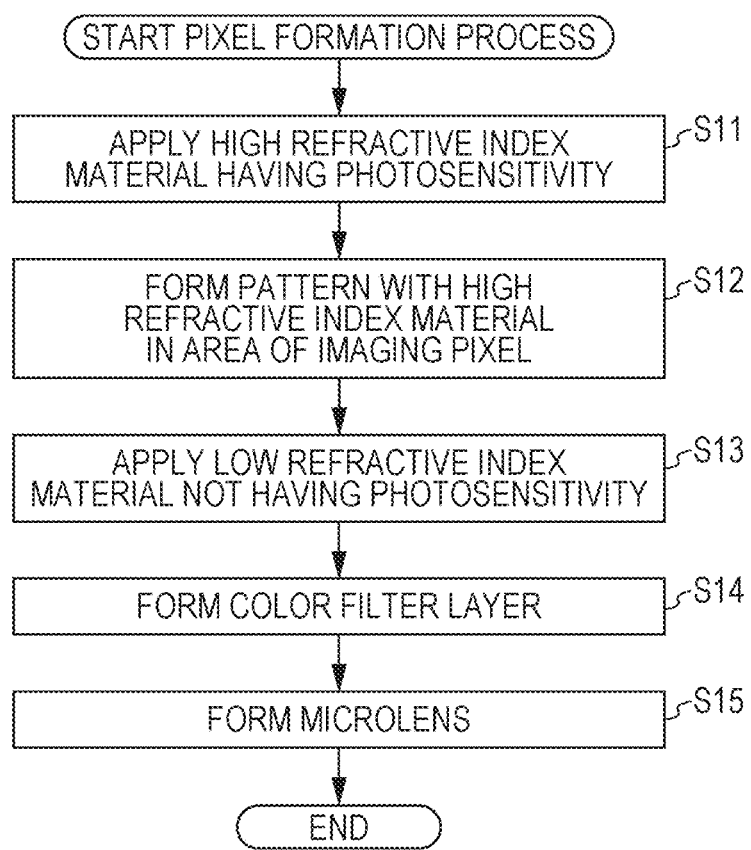
FIG. 4 is a flowchart illustrating a pixel formation process.

Next, a flow of the pixel formation of the embodiment will be described with reference to FIGS. 4 to 6C. FIG. 4 is a flowchart illustrating a pixel formation process, and FIGS. 5A to 6C are cross-sectional views showing a pixel formation step.

Figure 5A:
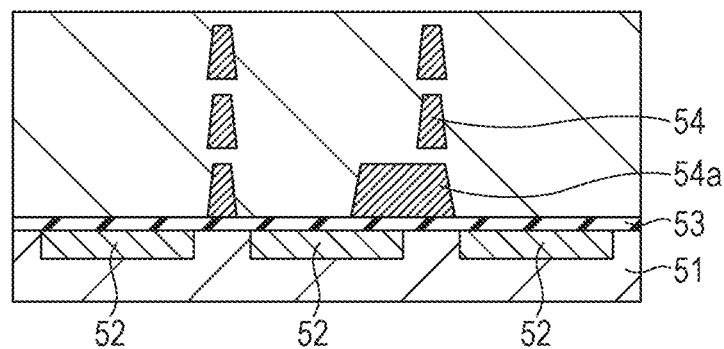
FIGS. 5A to 5C are diagrams illustrating a pixel formation step.

Hereinafter, as shown in FIG. 5A, a process after the wire layer 54 is formed will be described.

Figure 5B:
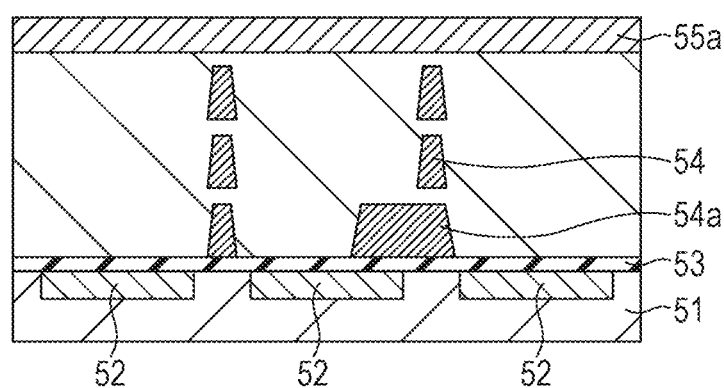

In Step S11, as shown in FIG. 5B, a high refractive index material 55a having a photosensitive property is applied on the wire layer 54. A film thickness of the high refractive index material 55a is, for example, set to 400 nm, but is adjusted according to the light condensing point of the microlens 57. A refractive index of the high refractive index material 55a is, for example, set to 1.8, but is only necessary to be higher than a refractive index of a low refractive index material which will be described later, by a value equal to or greater than 0.1.

After the high refractive index material 55a is applied, heating is performed at 90° C. for 2 minutes, in order to remove a solvent of the high refractive index material 55a and to harden the high refractive index material 55a.

Figure 5C:
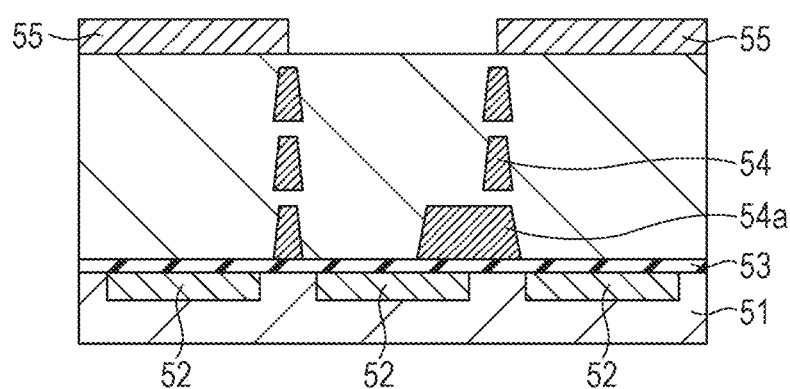

In Step S12, a pattern of the high refractive index material 55a in an area of the imaging pixel 31 is formed by photolithography. The pattern of the high refractive index material 55a is formed to have a size substantially the same as the pixel size (size within ±15% of the pixel size), for example. Accordingly, as shown in FIG. 5C, the high refractive index film 55 is formed.

After the high refractive index film 55 is formed, heating is performed at 200° C. for 5 minutes in order to harden the high refractive index film 55.

Figure 6A:
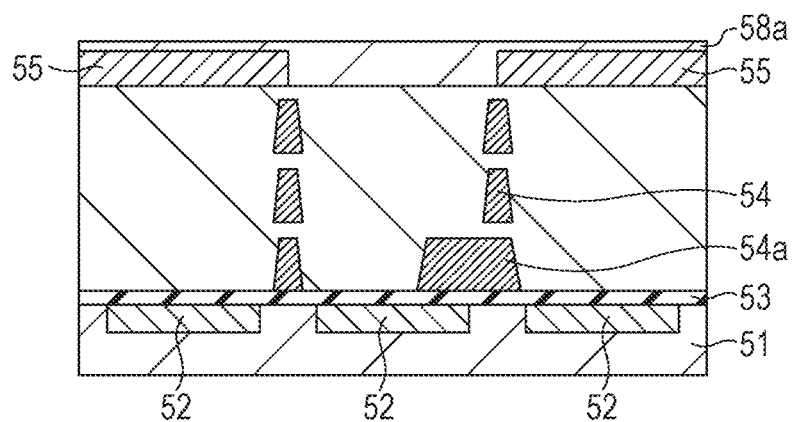
FIGS. 6A to 6C are diagrams illustrating a pixel formation step.

In Step S13, as shown in FIG. 6A, a low refractive index material 58a not having a photosensitive property is applied so as to cover the high refractive index film 55 by spin coating. A film thickness of the low refractive index material 58a is, for example, set to 600 nm, but is adjusted according to the light condensing point of the microlens 57. A refractive index of the low refractive index material 58a is, for example, set to 1.2, but is only necessary to be lower than the refractive index of the high refractive index material 55a described above, by a value equal to or greater than 0.1.

Accordingly, the low refractive index film 58 is formed in the area of the phase difference detection pixel 32. Since the low refractive index material 58a is applied so as to cover the high refractive index film 55, the low refractive index material 58a functions as a flattening film with respect to the color filter layer 56 formed in a process in a later stage.

After the low refractive index material 58a is applied, heating is performed at 230° C. for 5 minutes, in order to remove a solvent of the low refractive index material 58a and to harden the low refractive index material 58a.

Figure 6B:
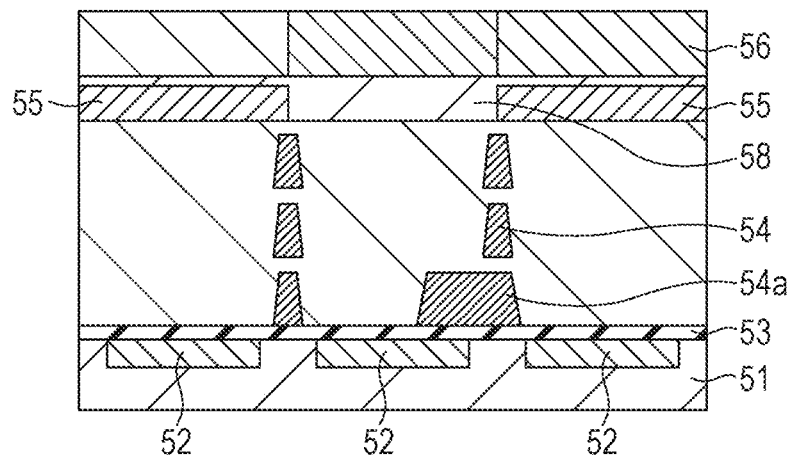

In Step S14, as shown in FIG. 6B, the color filter layer 56 is formed for each pixel.

Figure 6C:
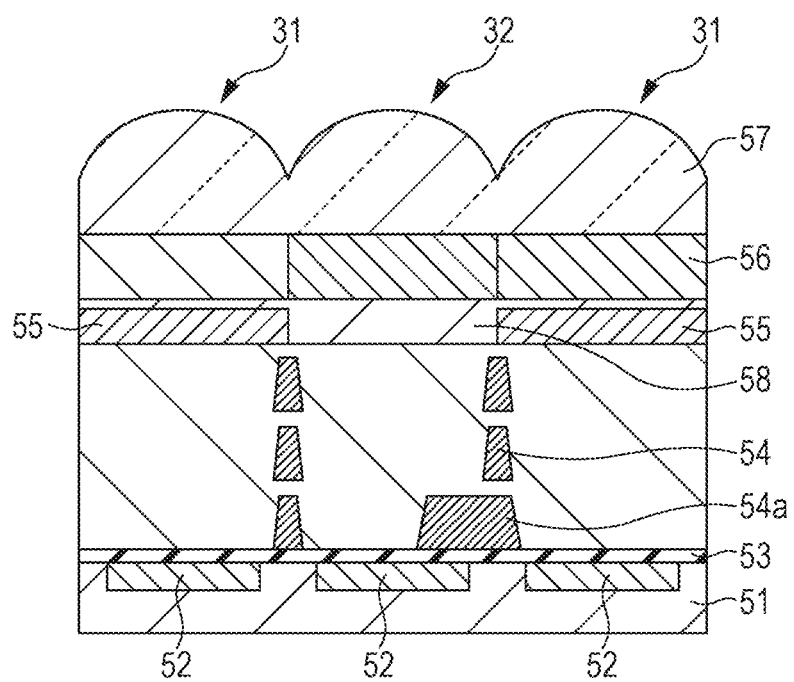

In Step S15, as shown in FIG. 6C, the microlens 57 is formed in the same manner in both of the imaging pixel 31 and the phase difference detection pixel 32. A microlens material is formed as a film by spin coating, and the microlens material is etched back through a photolithography step, and accordingly, the microlens 57 is formed.

By doing so, the imaging pixel 31 and the phase difference detection pixel 32 are formed.

According to the processes described above, since the high refractive index film 55 is formed on the upper side of the photoelectric conversion unit 52 in the imaging pixel 31 and the low refractive index film 58 is formed on the upper side of the photoelectric conversion unit 52 in the phase difference detection pixel 32, the light condensing point of the microlens 57 can be set on the light receiving surface of the photoelectric conversion unit 52 in the imaging pixel 31, and the light condensing point of the microlens 57 can be set on the upper surface of the light shielding film 54a in the phase difference detection pixel 32. That is, it is possible to optimize the sensitivity of the imaging pixel and the AF performance of the phase difference detection pixel.

In the processes described above, since the microlenses are formed in the same manner, it is possible to suppress degradation of an image due to variation of light condensing characteristics.

Other Configuration Example of Pixel

Figure 7:
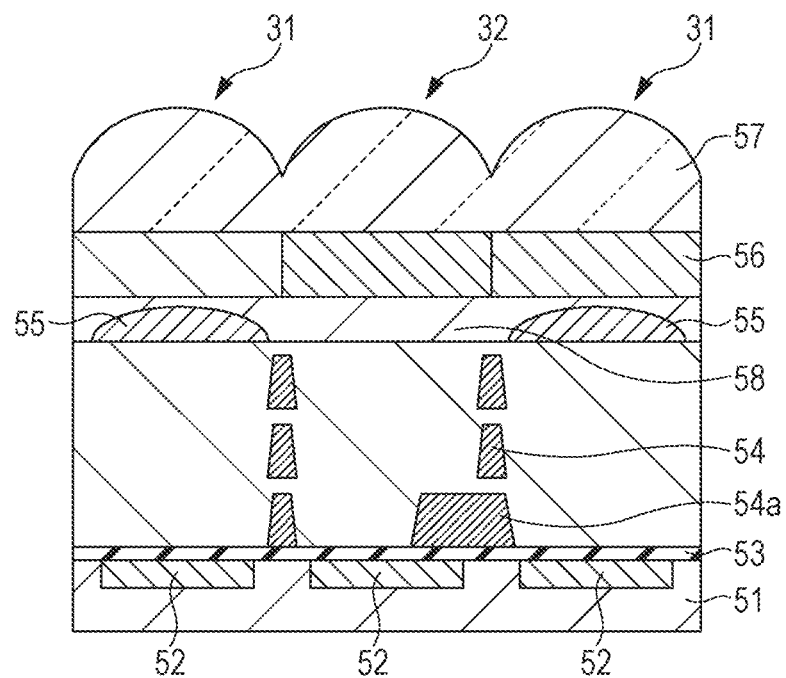
FIG. 7 is a cross-sectional view showing another configuration example of a pixel.

As described above, a cross-sectional shape of the high refractive index film 55 of the imaging pixel 31 is set as a rectangle, but the cross-sectional shape of the high refractive index film 55 may be formed in a shape of a convex lens by photolithography, as shown in FIG. 7.

Configuration Example of Pixel of Second Embodiment

Next, a configuration example of pixels of a second embodiment will be described with reference to FIG. 8.

Figure 8:
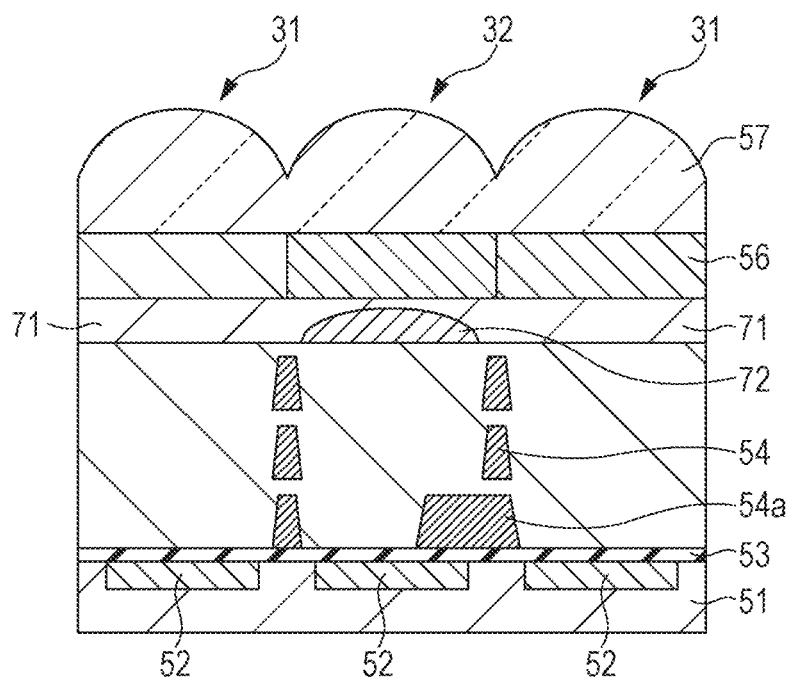
FIG. 8 is a cross-sectional view showing a configuration example of a pixel of a second embodiment of the present technology.

The description of the portions of the imaging pixels 31 and the phase difference detection pixels 32 shown in FIG. 8 and the imaging pixels 31 and the phase difference detection pixels 32 shown in FIG. 3 which are formed in the same manner, will be omitted.

As shown in FIG. 8, a high refractive index film 71 formed of a high refractive index material not having a photosensitive property is formed between the wire layer 54 and the color filter layer 56, in the imaging pixel 31. Examples of the high refractive index material not having a photosensitive property include $TiO_2$, $ZrO_2$, ZnO, and the like. The high refractive index film 71 is formed so as to cover a low refractive index film 72 of the phase difference detection pixel 32, and also functions as a flattening film when the color filter layer 56 is formed.

A low refractive index film 72 formed of a low refractive index material having a photosensitive property is formed between the wire layer 54 and the color filter layer 56, in the phase difference detection pixel 32. As the low refractive index material having a photosensitive property, hollow silica is used, for example. In FIG. 8, the low refractive index film 72 is formed so that the cross-sectional shape thereof is formed in a shape of a convex lens, but may be formed so that the cross-sectional shape thereof is set as a rectangle.

Also, in the embodiment, in the imaging pixel 31 and the phase difference detection pixel 32, the microlenses 57 are formed in the same manner, that is, the microlenses 57 are formed in the same shape and size, and have the same light condensing point, but the specific setting thereof can be performed by adjusting a refractive index or a film thickness of the high refractive index film 71 or the low refractive index film 72.

That is, the light condensing point of the microlens 57 in the imaging pixel 31 can be set on the light receiving surface of the photoelectric conversion unit 52 by the high refractive index film 71, and the light condensing point of the microlens 57 in the phase difference detection pixel 32 can be set on the upper surface of the light shielding film 54a by the low refractive index film 72.

According to the configuration of the embodiment, since the high refractive index film 71 is provided on the upper side of the photoelectric conversion unit 52 in the imaging pixel 31 and the low refractive index film 72 is provided on the upper side of the photoelectric conversion unit 52 in the phase difference detection pixel 32, the light condensing point of the microlens 57 can be set on the light receiving surface of the photoelectric conversion unit 52 in the imaging pixel 31, and the light condensing point of the microlens 57 can be set on the upper surface of the light shielding film 54a in the phase difference detection pixel 32. That is, it is possible to optimize the sensitivity of the imaging pixel and the AF performance of the phase difference detection pixel.

Flow of Pixel Formation

Next, a flow of the pixel formation of the embodiment will be described with reference to FIGS. 9 to 11C. FIG. 9 is a flowchart illustrating a pixel formation process, and FIGS. 10A to 11C are cross-sectional views showing a pixel formation step.

Figure 10A:
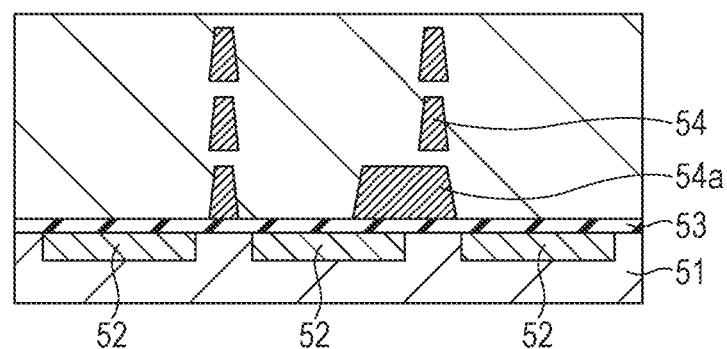
FIGS. 10A to 10D are diagrams illustrating a pixel formation step.

Also, hereinafter, as shown in FIG. 10A, a process after the wire layer 54 is formed will be described.

Figure 10B:
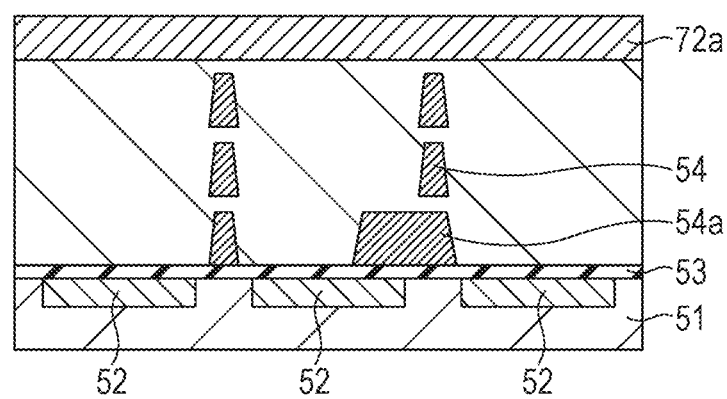

In Step S31, as shown in FIG. 10B, a low refractive index material 72a having a photosensitive property is applied on the wire layer 54. A film thickness of the low refractive index material 72a is, for example, set to 400 nm, but is adjusted according to the light condensing point of the microlens 57. A refractive index of the low refractive index material 72a is, for example, set to 1.4, but is only necessary to be lower than a refractive index of a high refractive index material which will be described later, by a value equal to or greater than 0.1.

After the low refractive index material 72a is applied, heating is performed at 90° C. for 2 minutes, in order to remove a solvent of the low refractive index material 72a and to harden the low refractive index material 72a.

Figure 10C:
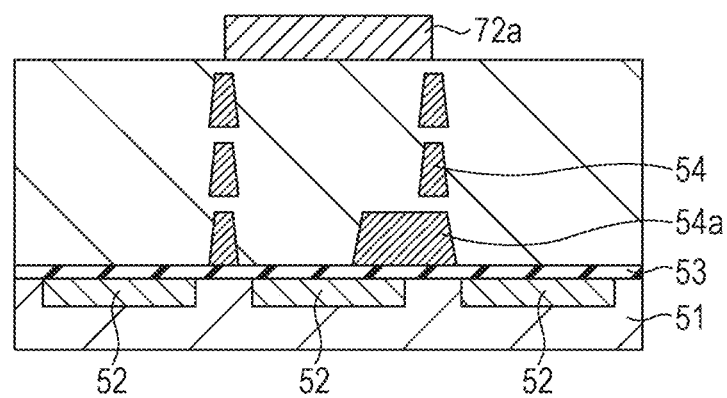

In Step S32, as shown in FIG. 10C, a pattern of the low refractive index material 72a in the area of the phase difference detection pixel 32 is formed by photolithography. The pattern of the high refractive index material 72a is formed to have a size substantially the same as the pixel size (size within ±15% of the pixel size), for example.

Figure 10D:
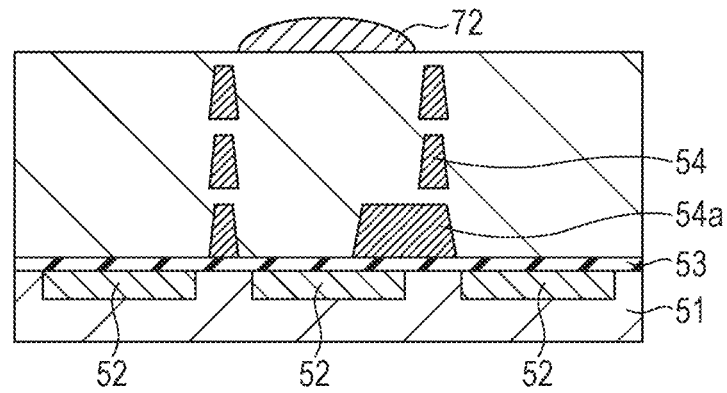

In Step S33, heating is performed and the low refractive index material 72a is subjected to reflow, and accordingly, the low refractive index material 72a is formed in a lens shape. Herein, heating is performed in a stepwise manner, by performing heating at 140° C. for 2 minutes and heating at 175° C. for 2 minutes, for example. Accordingly, as shown in FIG. 10D, the low refractive index film 72 having a cross-sectional shape of a convex lens shape is formed.

After the lens shape is formed, heating is performed at 250° C. while emitting ultraviolet (UV) light, in order to decompose a photosensitive material included in the low refractive index material 72a and to harden the low refractive index material 72a.

Figure 11A:
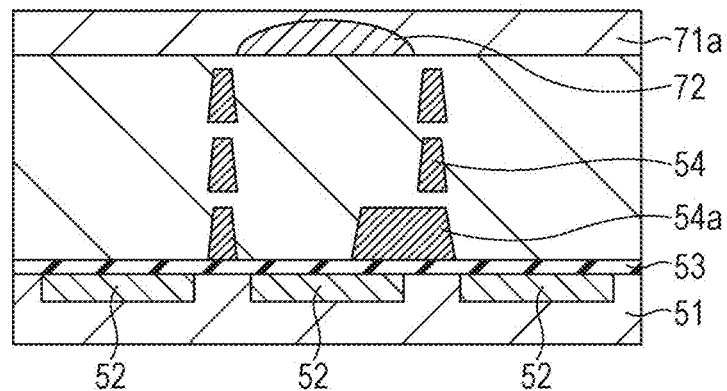
FIGS. 11A to 11C are diagrams illustrating a pixel formation step.

In Step S34, as shown in FIG. 11A, a high refractive index material 71a not having a photosensitive property is applied so as to cover the low refractive index film 72 by spin coating. A film thickness of the high refractive index material 71a is, for example, set to 600 nm, but is adjusted according to the light condensing point of the microlens 57.

A refractive index of the high refractive index material 71*a* is, for example, set to 1.8, but is only necessary to be higher than the refractive index of the low refractive index material 72*a* described above, by a value equal to or greater than 0.1.

Accordingly, the high refractive index film 71 is formed in the area of the imaging pixel 31. Since the high refractive index material 71*a* is applied so as to cover the low refractive index film 72, the high refractive index material 71*a* functions as a flattening film with respect to the color filter layer 56 formed in a process in a later stage.

After the high refractive index material 71*a* is applied, heating is performed at 230° C. for 5 minutes, in order to remove a solvent of the high refractive index material 71*a* and to harden the high refractive index material 71*a*.

Figure 11B:
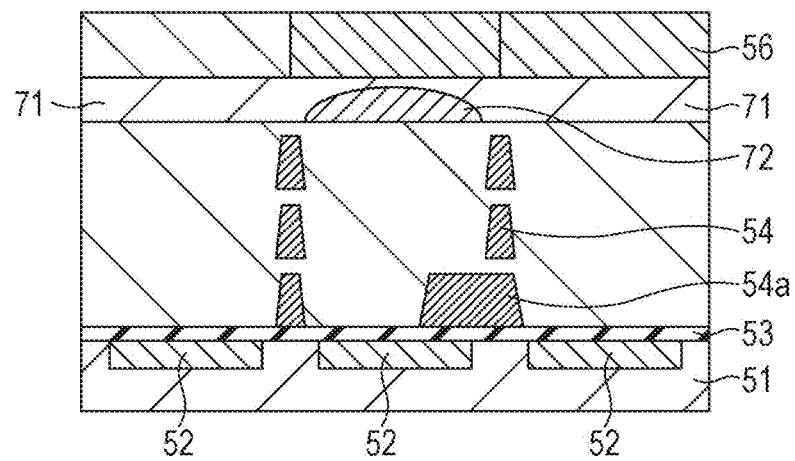

In Step S35, as shown in FIG. 11B, the color filter layer 56 is formed for each pixel.

Figure 11C:
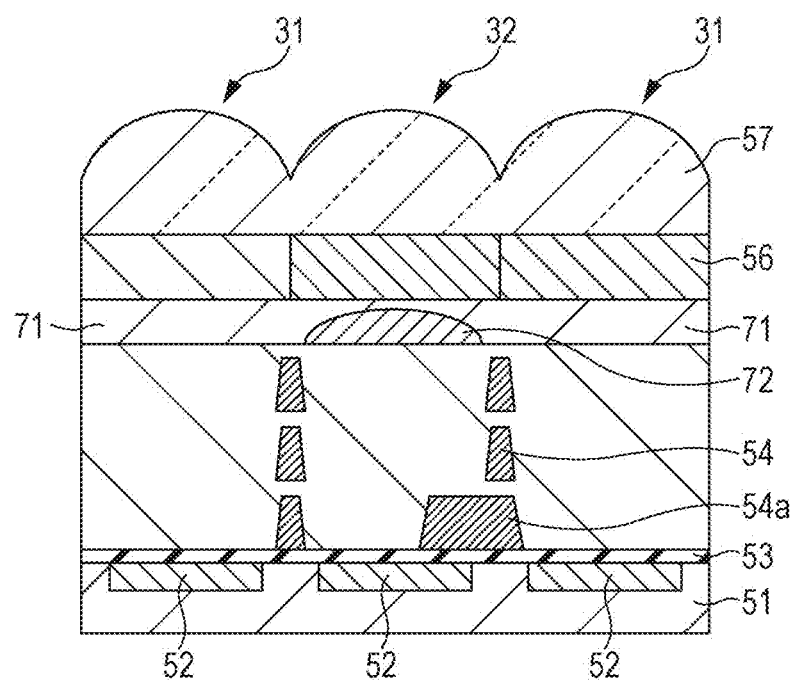

In Step S36, as shown in FIG. 11C, the microlens 57 is formed in the same manner in both of the imaging pixel 31 and the phase difference detection pixel 32, in the same manner as in the first embodiment.

By doing so, the imaging pixel 31 and the phase difference detection pixel 32 are formed.

According to the processes described above, since the high refractive index film 71 is formed on the upper side of the photoelectric conversion unit 52 in the imaging pixel 31 and the low refractive index film 72 is formed on the upper side of the photoelectric conversion unit 52 in the phase difference detection pixel 32, the light condensing point of the microlens 57 can be set on the light receiving surface of the photoelectric conversion unit 52 in the imaging pixel 31, and the light condensing point of the microlens 57 can be set on the upper surface of the light shielding film 54*a* in the phase difference detection pixel 32. That is, it is possible to optimize the sensitivity of the imaging pixel and the AF performance of the phase difference detection pixel.

Also, in the processes described above, since the microlenses are formed in the same manner, it is possible to suppress degradation of an image due to variation of light condensing characteristics.

Configuration Example of Pixel of Third Embodiment

Next, a configuration example of pixels of a third embodiment will be described with reference to FIG. 12.

Figure 12:
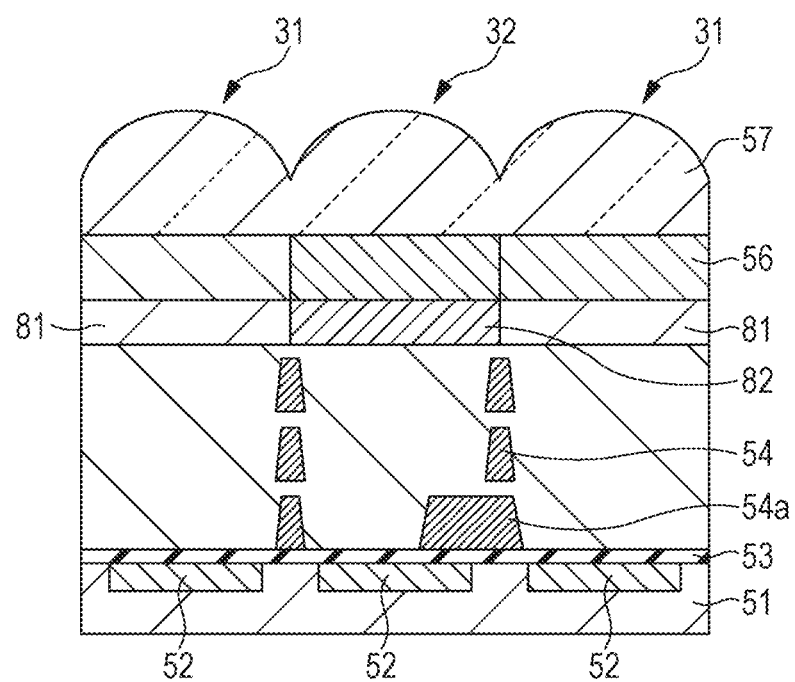
FIG. 12 is a cross-sectional view showing a configuration example of a pixel of a third embodiment of the present technology.

The description of the portions of the imaging pixels 31 and the phase difference detection pixels 32 shown in FIG. 12 and the imaging pixels 31 and the phase difference detection pixels 32 shown in FIG. 3 which are formed in the same manner, will be omitted.

As shown in FIG. 12, a high refractive index film 81 formed of a high refractive index material having a photosensitive property is formed between the wire layer 54 and the color filter layer 56, in the imaging pixel 31. Examples of the high refractive index material having a photosensitive property include $TiO_2$, $ZrO_2$, ZnO, and the like.

A low refractive index film 82 formed of a low refractive index material having a photosensitive property is formed between the wire layer 54 and the color filter layer 56, in the phase difference detection pixel 32. As the low refractive index material having a photosensitive property, hollow silica is used, for example.

Also, in the embodiment, in the imaging pixel 31 and the phase difference detection pixel 32, the microlenses 57 are formed in the same manner, that is, the microlenses 57 are formed in the same shape and size, and have the same light condensing point, but the specific setting thereof can be performed by adjusting a refractive index or a film thickness of the high refractive index film 81 or the low refractive index film 82.

That is, the light condensing point of the microlens 57 in the imaging pixel 31 can be set on the light receiving surface of the photoelectric conversion unit 52 by the high refractive index film 81, and the light condensing point of the microlens 57 in the phase difference detection pixel 32 can be set on the upper surface of the light shielding film 54*a* by the low refractive index film 82.

According to the configuration of the embodiment, since the high refractive index film 81 is provided on the upper side of the photoelectric conversion unit 52 in the imaging pixel 31 and the low refractive index film 82 is provided on the upper side of the photoelectric conversion unit 52 in the phase difference detection pixel 32, the light condensing point of the microlens 57 can be set on the light receiving surface of the photoelectric conversion unit 52 in the imaging pixel 31, and the light condensing point of the microlens 57 can be set on the upper surface of the light shielding film 54*a* in the phase difference detection pixel 32. That is, it is possible to optimize the sensitivity of the imaging pixel and the AF performance of the phase difference detection pixel.

Flow of Pixel Formation

Figure 13:
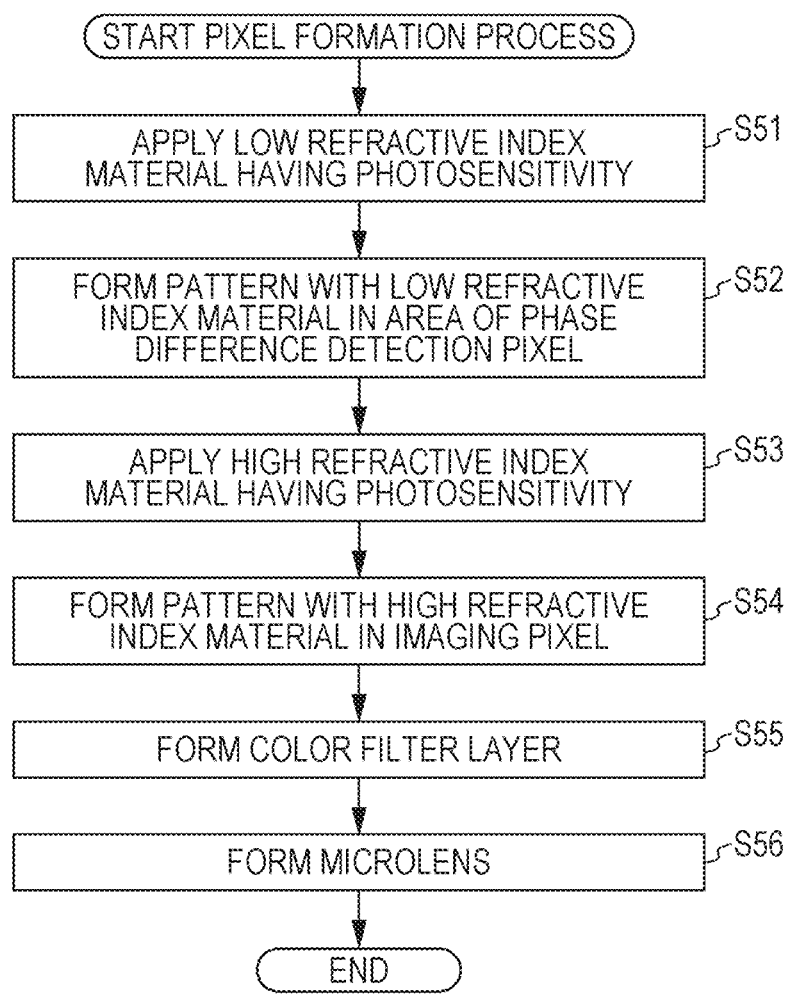
FIG. 13 is a flowchart illustrating a pixel formation process.

Next, a flow of the pixel formation of the embodiment will be described with reference to FIGS. 13 to 15C. FIG. 13 is a flowchart illustrating a pixel formation process, and FIGS. 14A to 15C are cross-sectional views showing a pixel formation step.

Figure 14A:
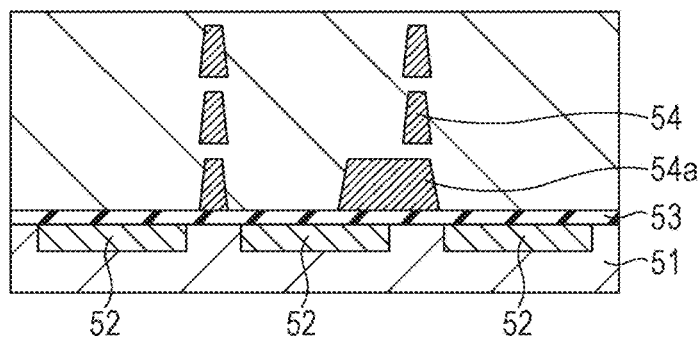
FIGS. 14A to 14D are diagrams illustrating a pixel formation step.

Also, hereinafter, as shown in FIG. 14A, a process after the wire layer 54 is formed will be described.

Figure 14B:
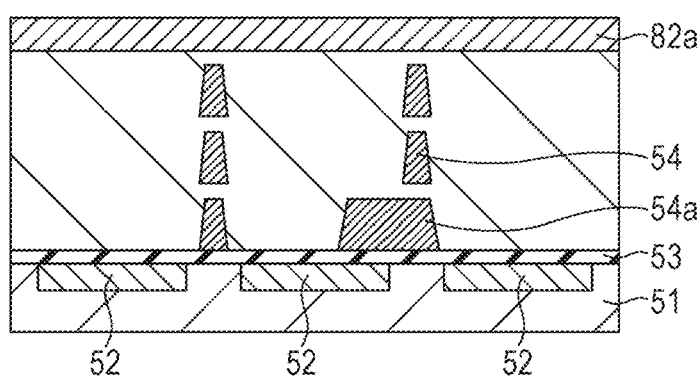

In Step S51, as shown in FIG. 14B, a low refractive index material 82*a* having a photosensitive property is applied onto the wire layer 54 by spin coating. A film thickness of the low refractive index material 82*a* is, for example, set to 400 nm, but is adjusted according to the light condensing point of the microlens 57. A refractive index of the low refractive index material 82*a* is, for example, set to 1.4, but is only necessary to be lower than a refractive index of a high refractive index material which will be described later, by a value equal to or greater than 0.1. The low refractive index material 82*a* is a negative type resist or may be a positive type resist.

Figure 14C:
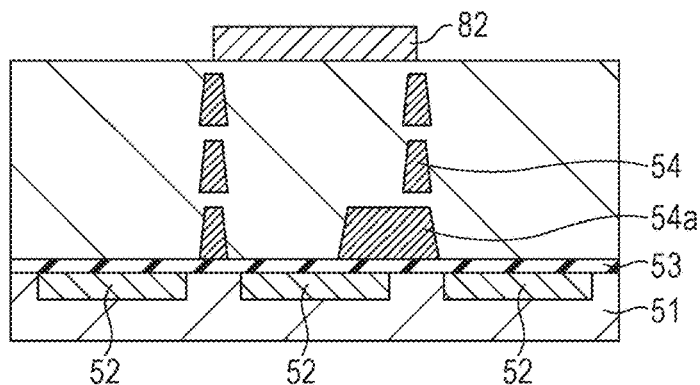

In Step S52, a pattern of the low refractive index material 82*a* in the area of the phase difference detection pixel 32 is formed by performing light exposure and development by photolithography. Accordingly, as shown in FIG. 14C, the low refractive index film 82 is formed.

Herein, after the development, heating is performed at 200° C. for 10 minutes, in order to remove a solvent of the low refractive index material 82*a* and to harden the low refractive index material 82*a*.

Figure 14D:
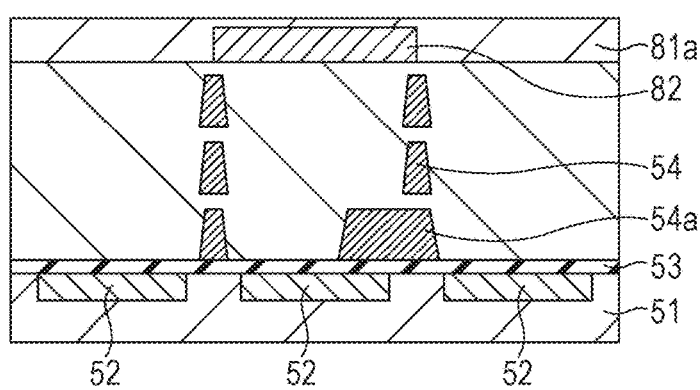

In Step S53, as shown in FIG. 14D, a high refractive index material 81*a* having a photosensitive property is applied so as to cover the low refractive index film 82 by spin coating. A film thickness of the high refractive index material 81*a* is, for example, set to 400 nm, but is adjusted according to the light condensing point of the microlens 57. A refractive index of the high refractive index material 81*a* is, for example, set to 1.8, but is only necessary to be higher than the refractive index of the low refractive index material 82*a* described above, by a value equal to or greater than 0.1. The high refractive index material 81*a* is a negative type resist or may be a positive type resist.

Figure 15A:
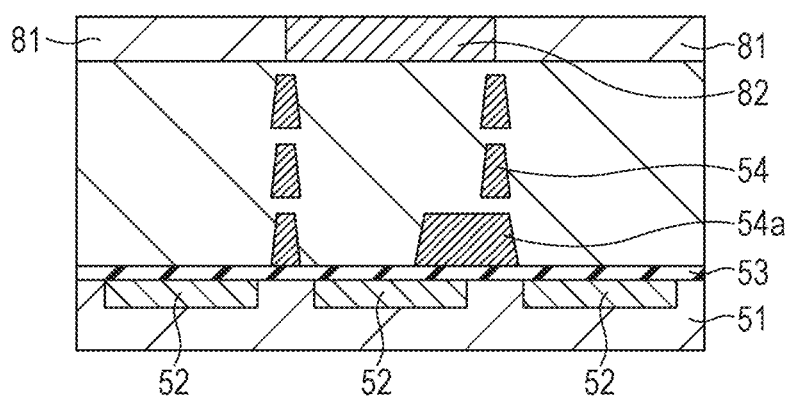
FIGS. 15A to 15C are diagrams illustrating a pixel formation step.

In Step S54, a pattern of the high refractive index material 81*a* in the area of the imaging pixel 31 is formed by performing light exposure and development by photolithography. Accordingly, as shown in FIG. 15A, a high refractive index film 81 is formed.

Herein, after the development, heating is performed at 200° C. for 10 minutes, in order to remove a solvent of the high refractive index material 81a and to harden the high refractive index material 81a.

Figure 15B:
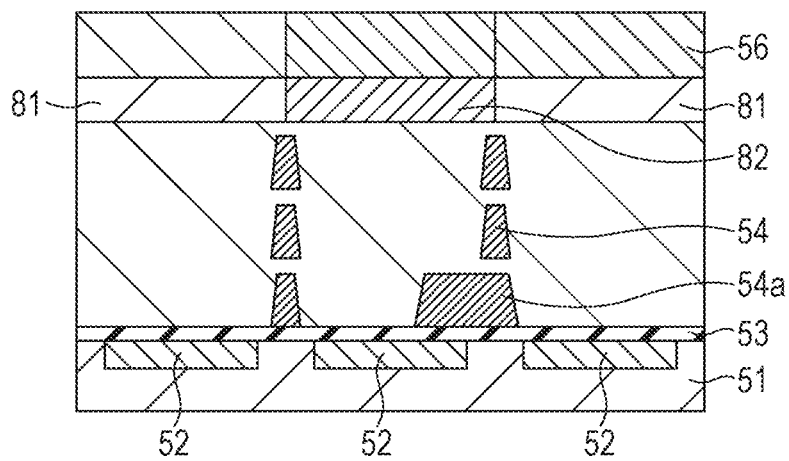

In Step S55, as shown in FIG. 15B, the color filter layer 56 is formed for each pixel.

Figure 15C:
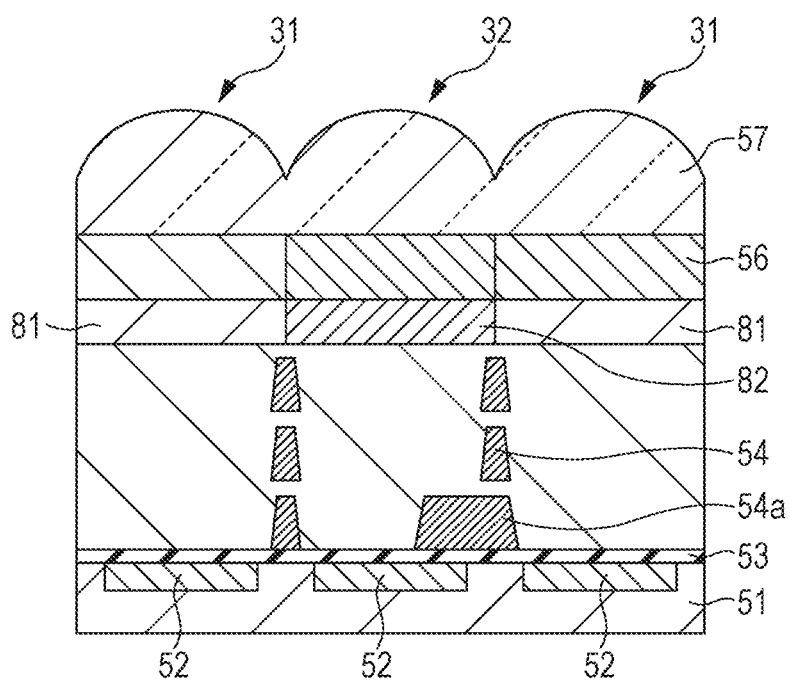

In Step S56, as shown in FIG. 15C, the microlens 57 is formed in the same manner in both of the imaging pixel 31 and the phase difference detection pixel 32, in the same manner as in the first embodiment.

By doing so, the imaging pixel 31 and the phase difference detection pixel 32 are formed.

According to the processes described above, since the high refractive index film 81 is formed on the upper side of the photoelectric conversion unit 52 in the imaging pixel 31 and the low refractive index film 82 is formed on the upper side of the photoelectric conversion unit 52 in the phase difference detection pixel 32, the light condensing point of the microlens 57 can be set on the light receiving surface of the photoelectric conversion unit 52 in the imaging pixel 31, and the light condensing point of the microlens 57 can be set on the upper surface of the light shielding film 54a in the phase difference detection pixel 32. That is, it is possible to optimize the sensitivity of the imaging pixel and the AF performance of the phase difference detection pixel.

Also, in the processes described above, since the microlenses are formed in the same manner, it is possible to suppress degradation of an image due to variation of light condensing characteristics.

In the processes described above, the high refractive index film 81 is formed after the low refractive index film 82 is formed, but the low refractive index film 82 may be formed after the high refractive index film 81 is formed.

Other Example of Flow of Pixel Formation

Herein, a flow of the pixel formation of the embodiment will be described with reference to FIGS. 16 to 18C. FIG. 16 is a flowchart illustrating a pixel formation process, and FIGS. 17A to 18C are cross-sectional views showing a pixel formation step.

Figure 17A:
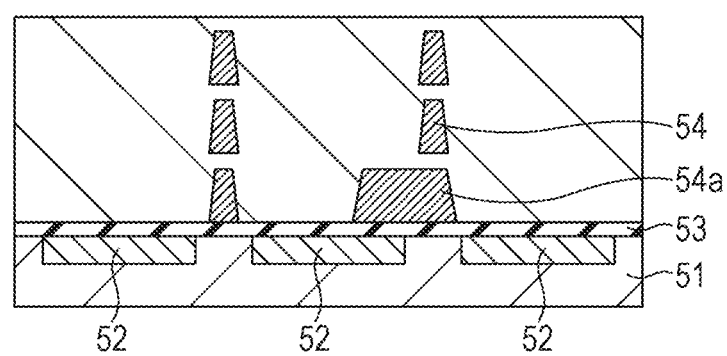
FIGS. 17A to 17D are diagrams illustrating a pixel formation step.

Also, hereinafter, as shown in FIG. 17A, a process after the wire layer 54 is formed will be described.

Figure 17B:
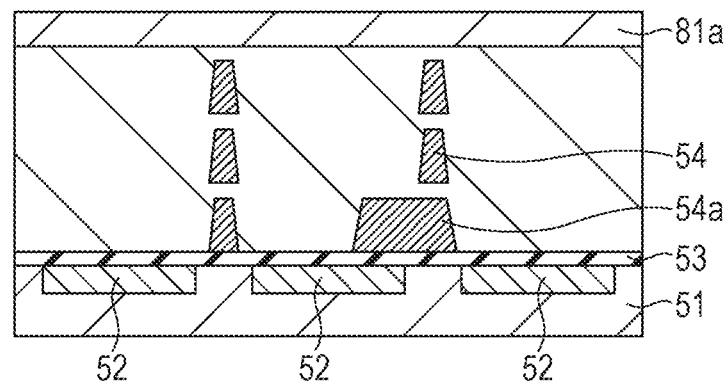

In Step S71, as shown in FIG. 17B, the high refractive index material 81a having a photosensitive property is applied onto the wire layer 54 by spin coating. The film thickness of the high refractive index material 81a is, for example, set to 500 nm, but is adjusted according to the light condensing point of the microlens 57. The refractive index of the high refractive index material 81a is, for example, set to 1.8, but is only necessary to be higher than a refractive index of a low refractive index material which will be described later, by a value equal to or greater than 0.1. The high refractive index material 81a is a negative type resist or may be a positive type resist.

Figure 17C:
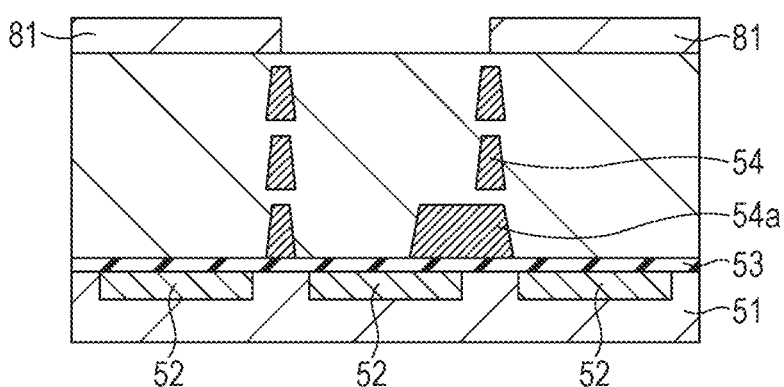

In Step S72, a pattern of the high refractive index material 81a in the area of the imaging pixel 31 is formed by performing light exposure and development by photolithography. Accordingly, as shown in FIG. 17C, the high refractive index film 81 is formed.

Herein, after the development, heating is performed at 200° C. for 10 minutes, in order to remove a solvent of the high refractive index material 81a and to harden the high refractive index material 81a.

Figure 17D:
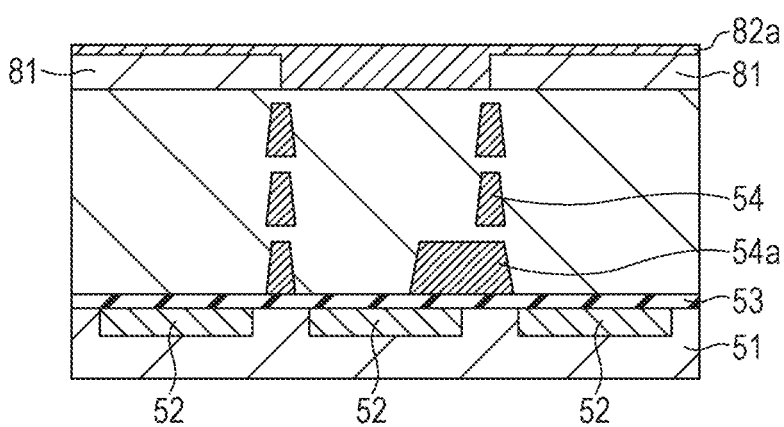

In Step S73, as shown in FIG. 17D, the low refractive index material 82a having a photosensitive property is applied so as to cover the high refractive index film 81 by spin coating. The film thickness of the low refractive index material 82a is, for example, set to 400 nm, but is adjusted according to the light condensing point of the microlens 57. The refractive index of the low refractive index material 82a is, for example, set to 1.2, but is only necessary to be lower than the refractive index of the high refractive index material 81a described above, by a value equal to or greater than 0.1. The low refractive index material 82a is a negative type resist or may be a positive type resist.

Figure 18A:
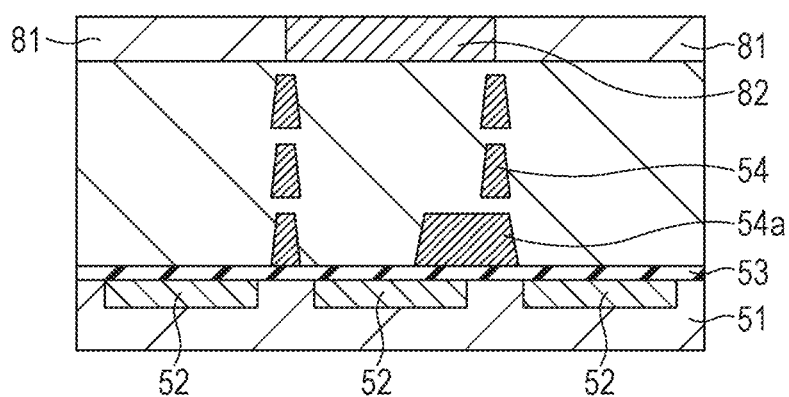
FIGS. 18A to 18C are diagrams illustrating a pixel formation step.

In Step S74, a pattern of the low refractive index material 82a in the area of the phase difference detection pixel 32 is formed by performing light exposure and development by photolithography. Accordingly, as shown in FIG. 18A, the low refractive index film 82 is formed.

Herein, after the development, heating is performed at 200° C. for 10 minutes, in order to remove a solvent of the low refractive index material 82a and to harden the low refractive index material 82a.

Figure 18B:
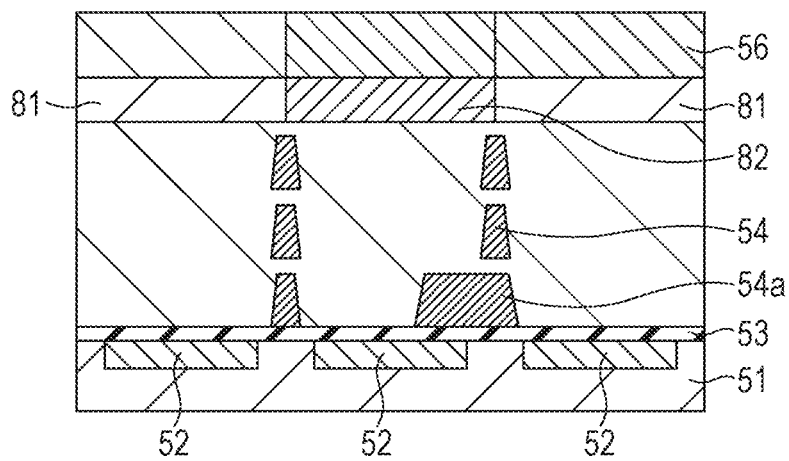

In Step S75, as shown in FIG. 18B, the color filter layer 56 is formed for each pixel.

Figure 18C:
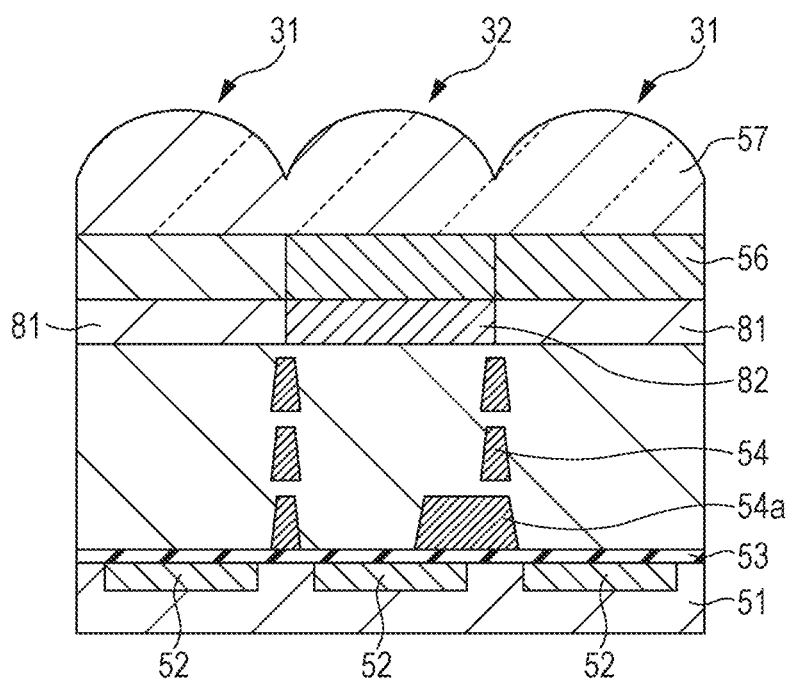

In Step S76, as shown in FIG. 18C, the microlens 57 is formed in the same manner in both of the imaging pixel 31 and the phase difference detection pixel 32, in the same manner as in the first embodiment.

By doing so, the imaging pixel 31 and the phase difference detection pixel 32 are formed.

Configuration Example of Pixels of Fourth Embodiment

Next, a configuration example of pixels of a fourth embodiment will be described with reference to FIG. 19.

Figure 19:
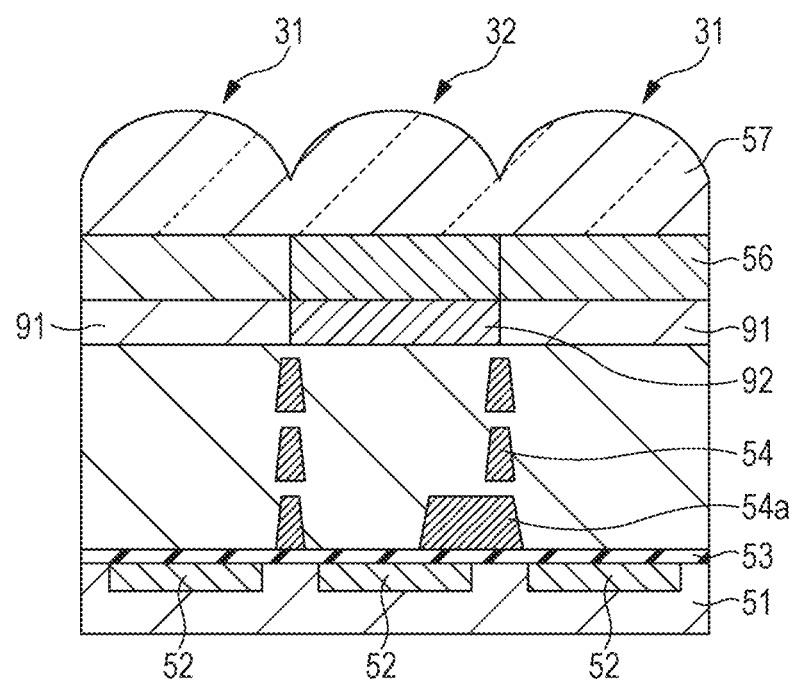
FIG. 19 is a cross-sectional view showing a configuration example of a pixel of a fourth embodiment of the present technology.

The description of the portions of the imaging pixels 31 and the phase difference detection pixels 32 shown in FIG. 19 and the imaging pixels 31 and the phase difference detection pixels 32 shown in FIG. 3 which are formed in the same manner, will be omitted.

As shown in FIG. 19, a high refractive index film 91 formed of a high refractive index material not having a photosensitive property is formed between the wire layer 54 and the color filter layer 56, in the imaging pixel 31. Examples of the high refractive index material not having a photosensitive property include $TiO_2$, $ZrO_2$, $ZnO$, and the like.

A low refractive index film 92 formed of a low refractive index material having a photosensitive property is formed between the wire layer 54 and the color filter layer 56, in the phase difference detection pixel 32. As the low refractive index material having a photosensitive property, hollow silica is used, for example.

Also, in the embodiment, in the imaging pixel 31 and the phase difference detection pixel 32, the microlenses 57 are formed in the same manner, that is, the microlenses 57 are formed in the same shape and size, and have the same light condensing point, but the specific setting thereof can be performed by adjusting a refractive index or a film thickness of the high refractive index film 91 or the low refractive index film 92.

That is, the light condensing point of the microlens 57 in the imaging pixel 31 can be set on the light receiving surface of the photoelectric conversion unit 52 by the high refractive index film 91, and the light condensing point of the microlens 57 in the phase difference detection pixel 32 can be set on the upper surface of the light shielding film 54a by the low refractive index film 92.

According to the configuration of the embodiment, since the high refractive index film 91 is provided on the upper side of the photoelectric conversion unit 52 in the imaging pixel 31 and the low refractive index film 92 is provided on the upper side of the photoelectric conversion unit 52 in the phase difference detection pixel 32, the light condensing point of the microlens 57 can be set on the light receiving surface of the photoelectric conversion unit 52 in the imaging pixel 31, and the light condensing point of the microlens 57 can be set on the upper surface of the light shielding film 54a in the phase difference detection pixel 32. That is, it is possible to optimize the sensitivity of the imaging pixel and the AF performance of the phase difference detection pixel.

Flow of Pixel Formation

Figure 20:
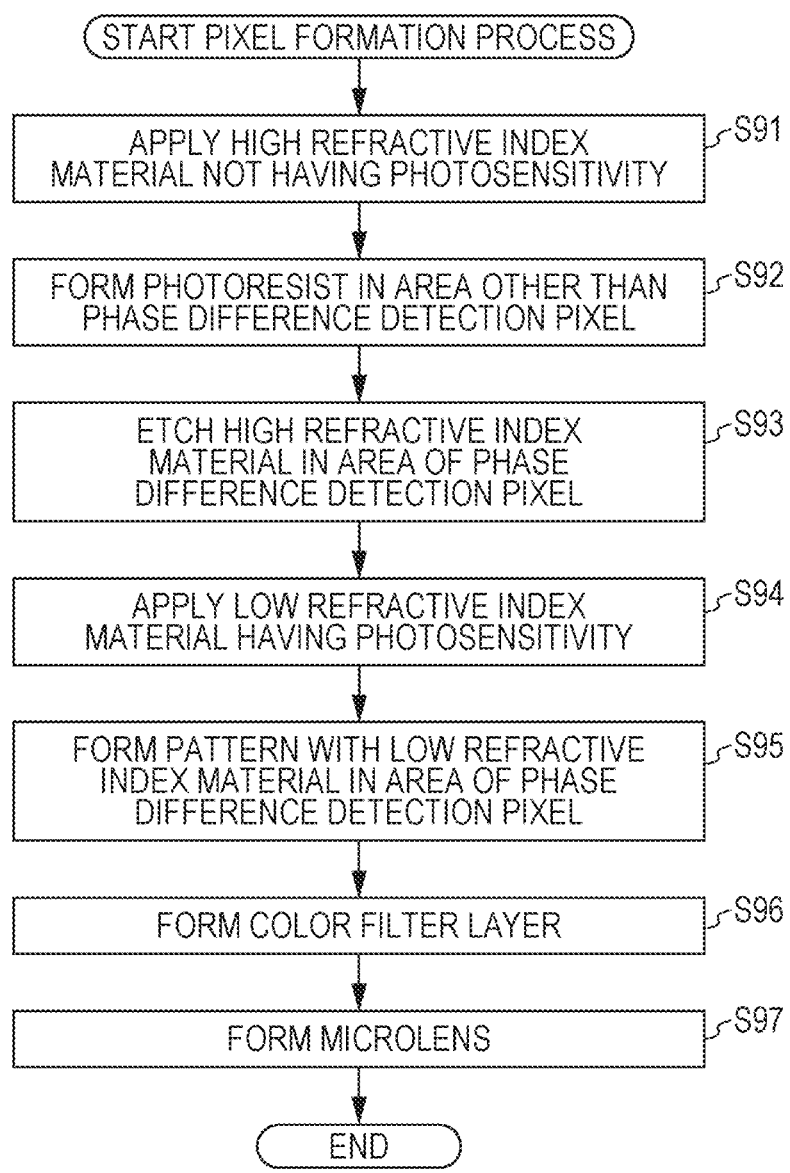
FIG. 20 is a flowchart illustrating a pixel formation process.

Next, a flow of the pixel formation of the embodiment will be described with reference to FIGS. 20 to 22D. FIG. 20 is a flowchart illustrating a pixel formation process, and FIGS. 21A to 22D are cross-sectional views showing a pixel formation step.

Figure 21A:
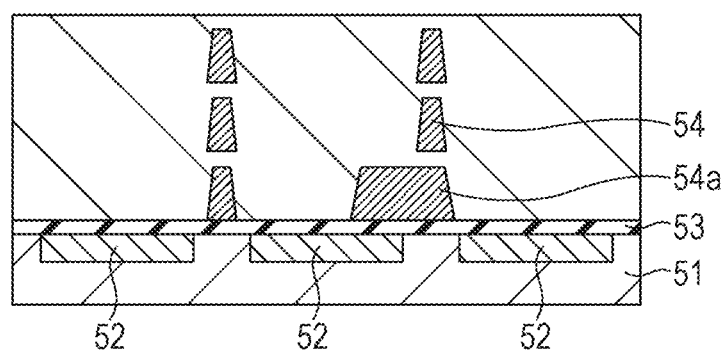
FIGS. 21A to 21D are diagrams illustrating a pixel formation step.

Also, hereinafter, as shown in FIG. 21A, a process after the wire layer 54 is formed will be described.

Figure 21B:
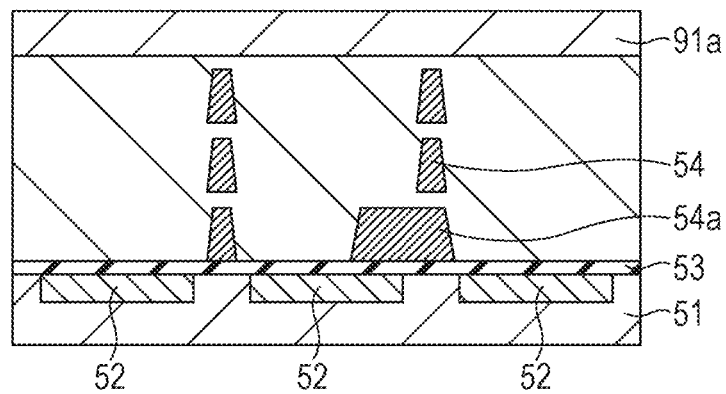

In Step S91, as shown in FIG. 21B, a high refractive index material 91a not having a photosensitive property is applied onto the wire layer 54 by spin coating. A film thickness of the high refractive index material 91a is, for example, set to 500 nm, but is adjusted according to the light condensing point of the microlens 57. A refractive index of the high refractive index material 91a is, for example, set to 1.8, but is only necessary to be higher than a refractive index of a low refractive index material which will be described later, by a value equal to or greater than 0.1.

After the high refractive index material 91a is applied, heating is performed at 200° C. for 10 minutes, in order to remove a solvent of the high refractive index material 91a and to harden the high refractive index material 91a.

Figure 21C:
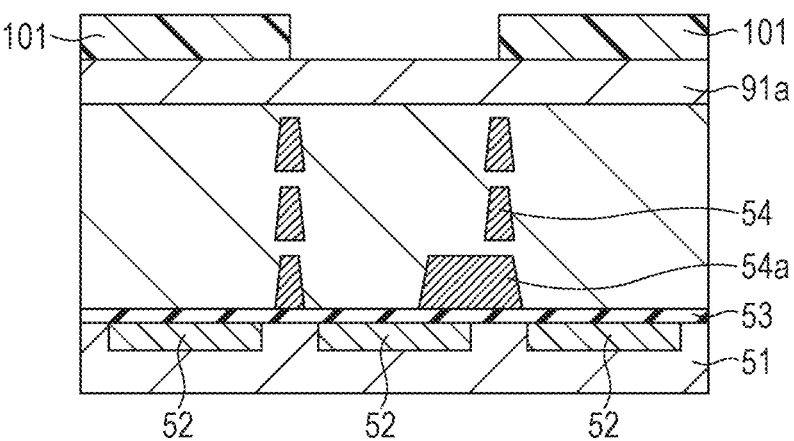

In Step S92, as shown in FIG. 21C, a photoresist 101 is formed in an area on the high refractive index material 91a other than the phase difference detection pixel 32 (that is, area of the imaging pixel 31).

Figure 21D:
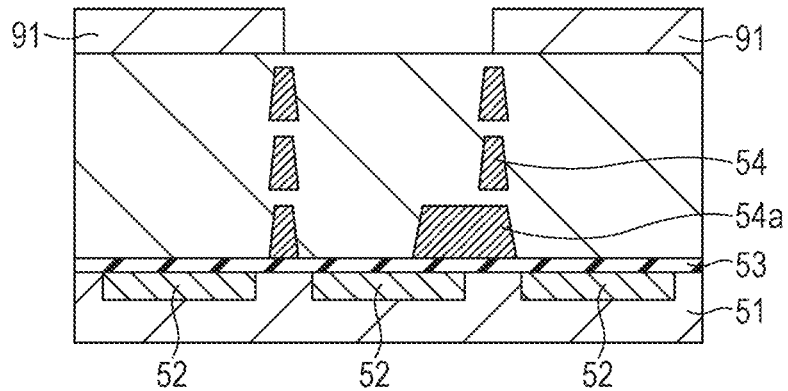

In Step S93, the high refractive index material 91a in the area of the phase difference detection pixel 32 is dry-etched. Accordingly, as shown in FIG. 21D, the high refractive index film 91 is formed.

Figure 22A:
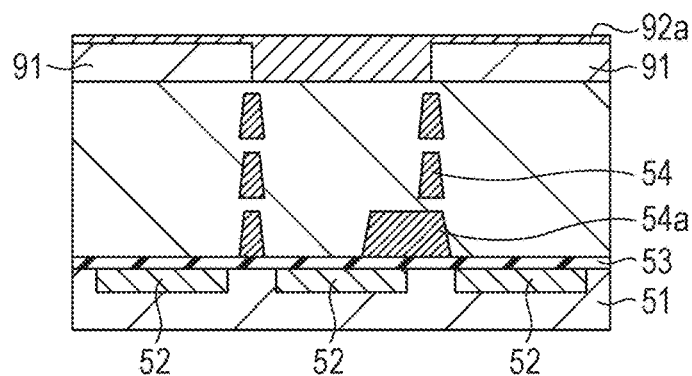
FIGS. 22A to 22D are diagrams illustrating a pixel formation step.

In Step S94, as shown in FIG. 22A, a low refractive index material 92a having a photosensitive property is applied so as to cover the high refractive index film 91 by spin coating. A film thickness of the low refractive index material 92a is, for example, set to 400 nm, but is adjusted according to the light condensing point of the microlens 57. A refractive index of the low refractive index material 92a is, for example, set to 1.4, but is only necessary to be lower than the refractive index of the high refractive index material 91a described above, by a value equal to or greater than 0.1. The low refractive index material 92a is a negative type resist or may be a positive type resist.

Figure 22B:
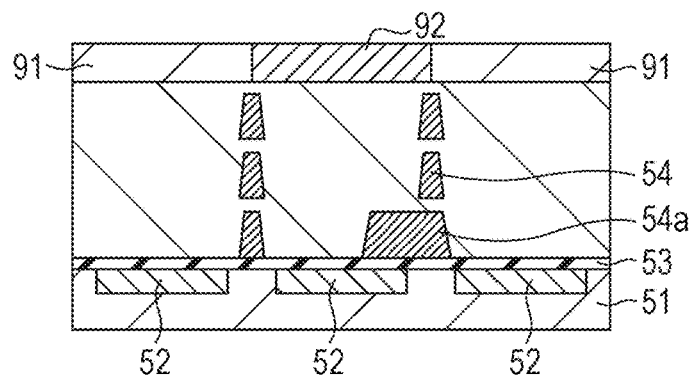

In Step S95, a pattern of the low refractive index material 92a in the area of the phase difference detection pixel 32 is formed by performing light exposure and development by photolithography. Accordingly, as shown in FIG. 22B, the low refractive index film 92 is formed.

Herein, i-ray exposure is only performed in the area of the phase difference detection pixel 32 with an exposure amount of 5000 J/m2 and a focus offset of 0 μm, and after the development, heating is performed at 200° C. for 10 minutes, in order to remove a solvent of the low refractive index material 92a and to harden the low refractive index material 92a.

Figure 22C:
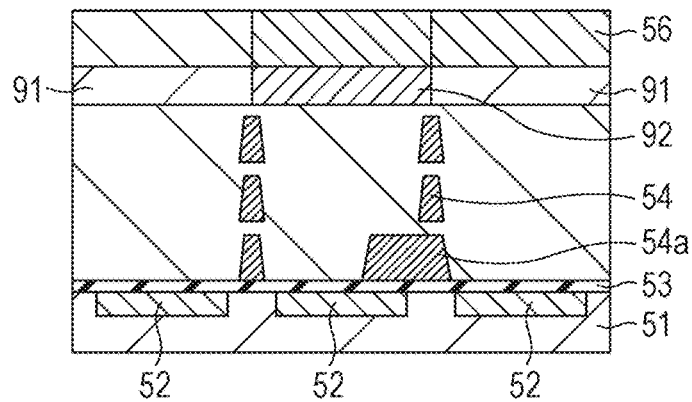

In Step S96, as shown in FIG. 22C, the color filter layer 56 is formed for each pixel.

Figure 22D:
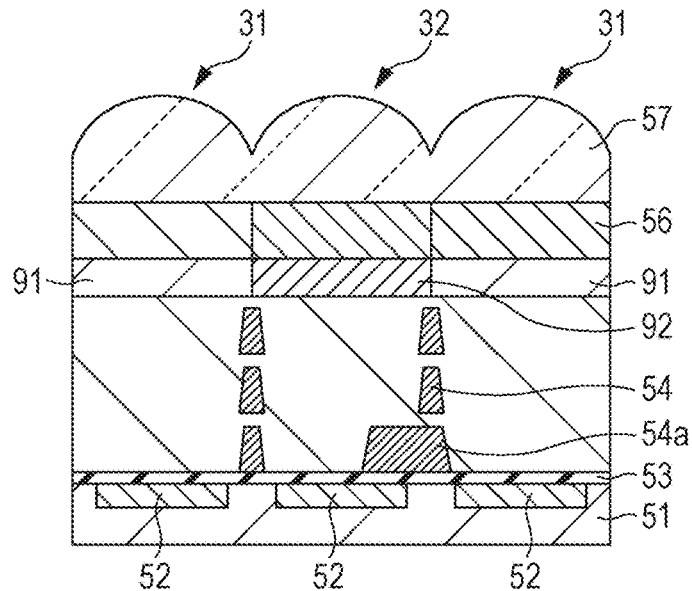

In Step S97, as shown in FIG. 22D, the microlens 57 is formed in the same manner in both of the imaging pixel 31 and the phase difference detection pixel 32, in the same manner as in the first embodiment.

According to the processes described above, since the high refractive index film 91 is formed on the upper side of the photoelectric conversion unit 52 in the imaging pixel 31 and the low refractive index film 92 is formed on the upper side of the photoelectric conversion unit 52 in the phase difference detection pixel 32, the light condensing point of the microlens 57 can be set on the light receiving surface of the photoelectric conversion unit 52 in the imaging pixel 31, and the light condensing point of the microlens 57 can be set on the upper surface of the light shielding film 54a in the phase difference detection pixel 32. That is, it is possible to optimize the sensitivity of the imaging pixel and the AF performance of the phase difference detection pixel.

As described above, the configuration in which the present technology is applied to the surface irradiation type CMOS image sensor has been described, but hereinafter, a configuration in which the present technology is applied to the rear surface irradiation type CMOS image sensor will be described.

Configuration Example of Pixels of Fifth Embodiment

Figure 23:
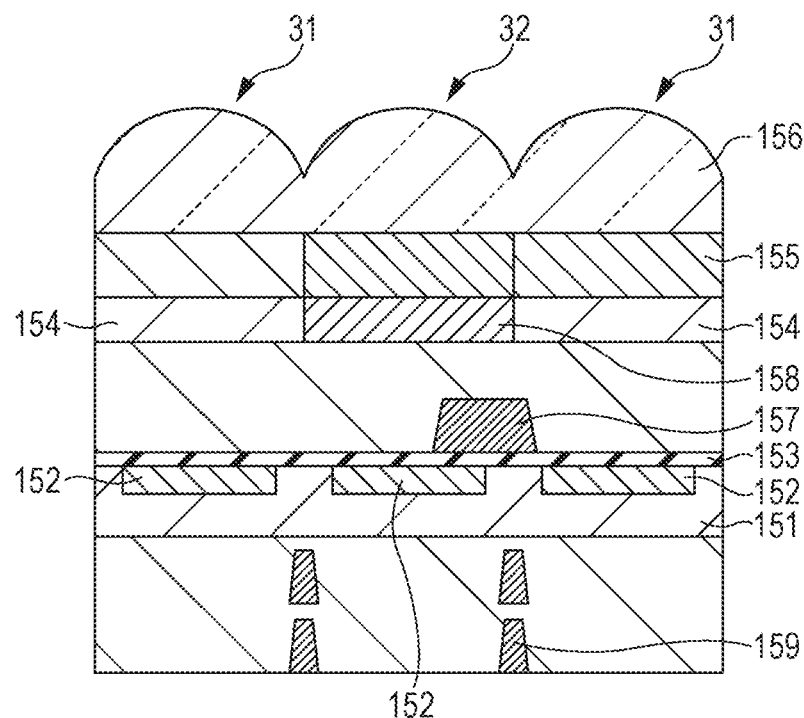
FIG. 23 is a cross-sectional view showing a configuration example of a pixel of a fifth embodiment of the present technology.

FIG. 23 is a cross-sectional view showing a configuration example of the pixels of the rear surface irradiation type CMOS image sensor 10 according to a fifth embodiment. FIG. 23 shows a cross-sectional view of the imaging pixels 31 and the phase difference detection pixels 32 of the rear surface irradiation type CMOS image sensor 10.

As shown in FIG. 23, in the imaging pixel 31, a photoelectric conversion unit 152 is formed on a semiconductor substrate 151 and an insulating layer 153 is formed on the upper layer of the semiconductor substrate 151.

A high refractive index film 154 formed of a high refractive index material is formed on the insulating layer 153. The high refractive index film 154 may be formed of a high refractive index material having a photosensitive property or may be formed of a high refractive index material not having a photosensitive property. A color filter layer 155 is formed on the high refractive index film 154, and a microlens 156 is formed on the color filter layer 155.

Meanwhile, the semiconductor substrate 151, the photoelectric conversion unit 152, the insulating layer 153, the color filter layer 155, and the microlens 156 are also formed in the phase difference detection pixel 32, in the same manner as the imaging pixel 31.

In the phase difference detection pixel 32, a light shielding film 157 is formed on the insulating layer 153 to have an opening having a size which is substantially half of a light receiving area of the photoelectric conversion unit 152. A low refractive index film 158 formed of a low refractive index material is formed on a lower portion of the color filter layer 155. The low refractive index film 158 may be a low refractive index material having a photosensitive property or may be formed of a low refractive index material not having a photosensitive property.

In the phase difference detection pixel 32, a light attenuating filter for attenuating incident light amount to the same extent as achieved by the color filter layer 155 may be formed instead of the color filter layer 155.

In the rear surface irradiation type CMOS image sensor 10, a wire layer 159 is formed on a surface opposite to the surface where the microlens 156 is formed.

Also, in the embodiment, in the imaging pixel 31 and the phase difference detection pixel 32, the microlenses 156 are formed in the same manner, that is, the microlenses 57 are formed in the same shape and size, and have the same light condensing point, but the specific setting thereof can be performed by adjusting a refractive index or a film thickness of the high refractive index film 154 or the low refractive index film 158.

That is, the light condensing point of the microlens 156 in the imaging pixel 31 can be set on the light receiving surface of the photoelectric conversion unit 152 by the high refractive index film 154, and the light condensing point of the microlens 156 in the phase difference detection pixel 32 can be set on the upper surface of the light shielding film 157 by the low refractive index film 158.

According to the configuration of the embodiment, since the high refractive index film 154 is provided on the upper side of the photoelectric conversion unit 152 in the imaging pixel 31 and the low refractive index film 158 is provided on the upper side of the photoelectric conversion unit 152 in the phase difference detection pixel 32, the light condensing point of the microlens 156 can be set on the light receiving surface of the photoelectric conversion unit 152 in the imaging pixel 31, and the light condensing point of the microlens 156 can be set on the upper surface of the light shielding film 157 in the phase difference detection pixel 32. That is, it is possible to optimize the sensitivity of the imaging pixel and the AF performance of the phase difference detection pixel.

In the configuration described above, since the high refractive index film is provided on the upper side of the photoelectric conversion unit in the imaging pixel and the low refractive index film is provided on the upper side of the photoelectric conversion unit in the phase difference detection pixel, the sensitivity of the phase difference detection pixel is decreased while optimizing the sensitivity of the imaging pixel, but these can also be realized by the other configuration.

Figure 24:
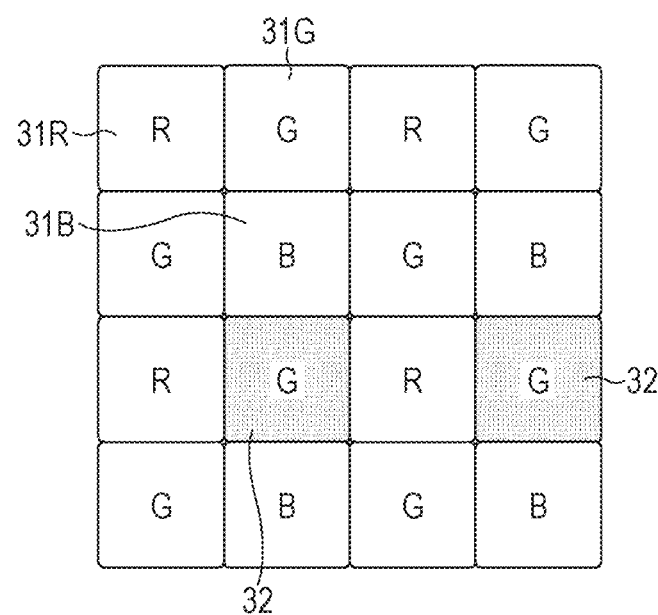
FIG. 24 is a diagram showing an example of a color filter.

Hereinafter, as shown in FIG. 24, a configuration in which some of G pixels 31G among R pixels 31R, G pixels 31G, and B pixels 31B as the imaging pixels 31 regularly arranged along a Bayer array are substituted with the phase difference detection pixels 32, will be described.

Configuration Example of Pixels of Sixth Embodiment

Figure 25:
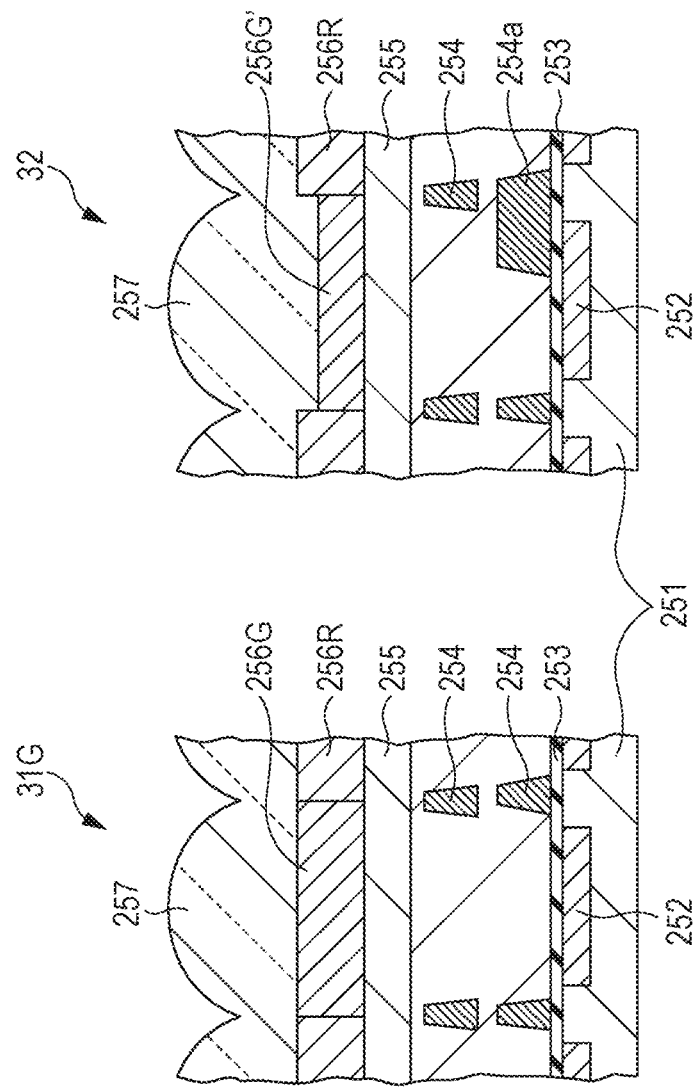
FIG. 25 is a cross-sectional view showing a configuration example of a pixel of a sixth embodiment of the present technology.

FIG. 25 is a cross-sectional view showing a configuration example of the pixels of the CMOS image sensor 10 according to the sixth embodiment. FIG. 25 shows a cross-sectional view of the G pixel 31G among the imaging pixels 31 of the CMOS image sensor 10 and the phase difference detection pixel 32.

As shown in FIG. 25, in the imaging pixel 31, a photoelectric conversion unit 252 which receives incident light and performs photoelectric conversion is formed on a semiconductor substrate 251, and an insulating layer 253 formed of SiO or the like is formed on the upper layer of the semiconductor substrate 251. A plurality of wire layers 254 formed of Cu or Al are formed on the insulating layer 253.

A flattening film 255 is formed on the wire layer 254, and a green color filter 256G having spectral characteristics corresponding to the G pixel 31G is formed on the flattening film 255. A microlens 257 is formed on the color filter 256G. In the example of FIG. 25, since a red color filter 256R is formed on the same layer as the color filter 256G, the R pixel 31R is formed adjacent to the G pixel 31G.

Meanwhile, the semiconductor substrate 251, the photoelectric conversion unit 252, the insulating layer 253, the wire layers 254, and the microlens 257 are also formed in the phase difference detection pixel 32, in the same manner as the G pixel 31G.

In the phase difference detection pixel 32, a part of the wire layer 254 is formed as a light shielding film 254*a* which shields some of the light incident to the photoelectric conversion unit 252, to have an opening having a size which is substantially half of a light receiving area of the photoelectric conversion unit 252. A color filter 256G' is formed on the same layer as the color filter 256G. The color filter 256G' is formed to have a film thickness smaller than that of the color filter 256G.

In the related art, for example, in the solid-state imaging device in which some of G pixels are substituted with the phase difference detection pixels, the film thickness of the green color filter is determined so as to optimize the sensitivity of the G pixel (imaging pixel). However, in the phase difference detection pixel, the sensitivity thereof is set to be lower than the sensitivity of the G pixel, by the light shielding film.

According to the configuration of the embodiment, since the color filter 256G' included in the phase difference detection pixel 32 is formed so as to have the film thickness to be smaller than the film thickness of the color filter 256G included in the G pixel 31G, it is possible to optimize the sensitivity of the imaging pixel and to suppress a decrease in the sensitivity of the phase difference detection pixel. That is, it is possible to optimize the sensitivity of the imaging pixel and the AF performance of the phase difference detection pixel.

In the imaging pixel 31 and the phase difference detection pixel 32, a shape or a size of the microlens 257 may be determined depending on the film thickness of the color filter 256G or the color filter 256G'.

Flow of Pixel Formation

Figure 26:
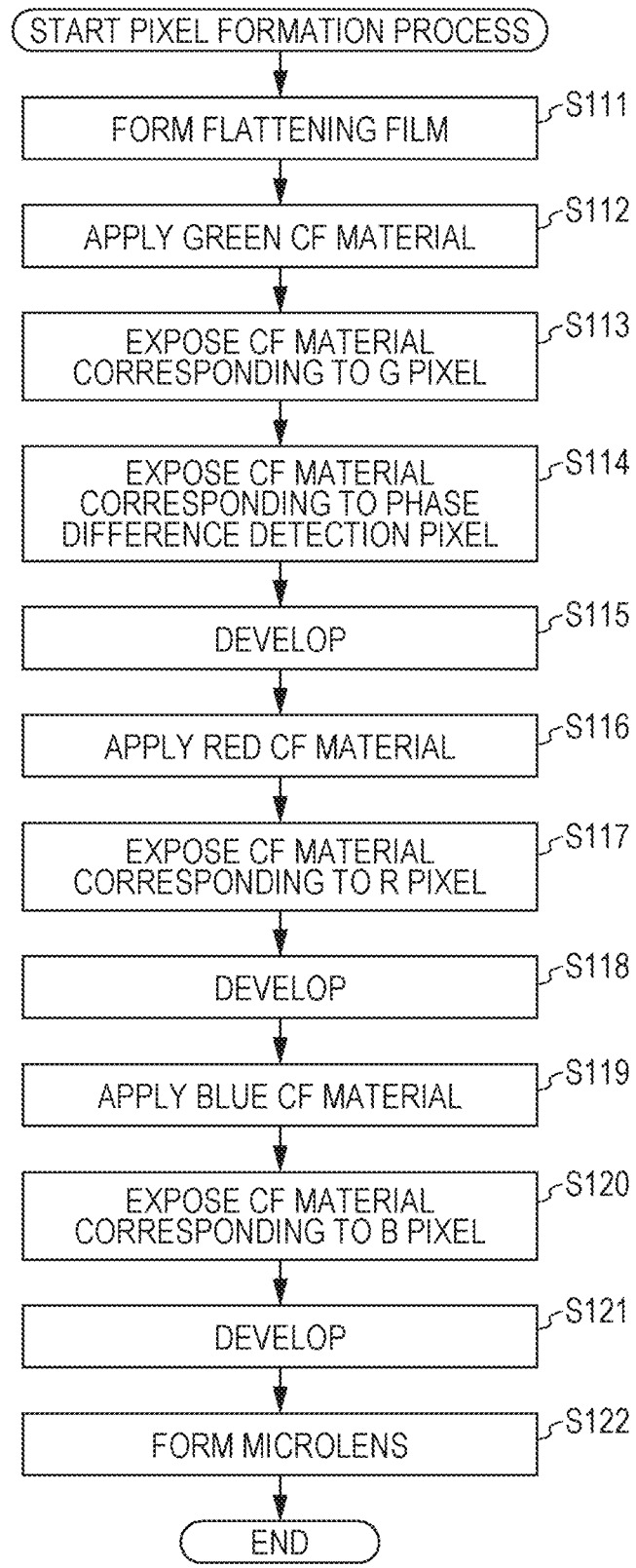
FIG. 26 is a flowchart illustrating a pixel formation process.

Next, a flow of the pixel formation of the embodiment will be described with reference to FIGS. 26 to 28C. FIG. 26 is a flowchart illustrating a pixel formation process, and FIGS. 27A to 28C are cross-sectional views showing a pixel formation step.

Hereinafter, a process after the wire layer 254 is formed will be described.

Figure 27A:
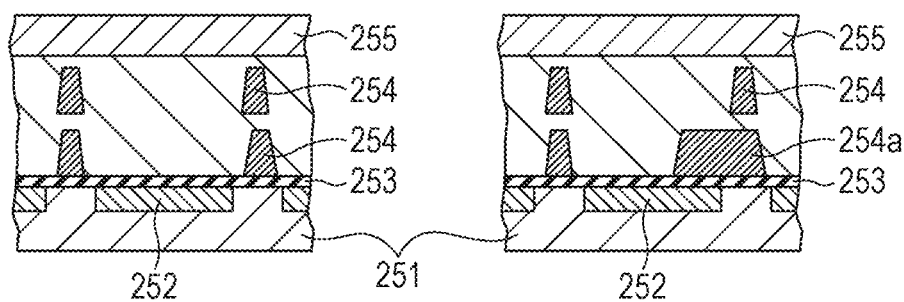
FIGS. 27A to 27D are diagrams illustrating a pixel formation step.

In Step S111, as shown in FIG. 27A, a flattening film 255 is formed on the wire layer 254.

Figure 27B:
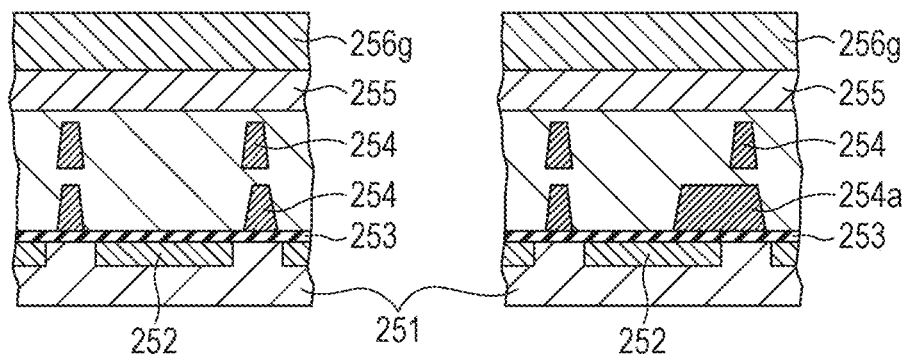

In Step S112, as shown in FIG. 27B, a green color filter (CF) material 256*g* is applied onto the flattening film 255. Hereinafter, a negative photoresist is used as the CF material 256*g*. A positive photoresist can be used as the CF material 256*g*, but in this case, an exposure pattern of a reticle used for light exposure is a reversed exposure pattern of a reticle which will be described later, and it is also necessary to set counter light exposure conditions.

Figure 27C:
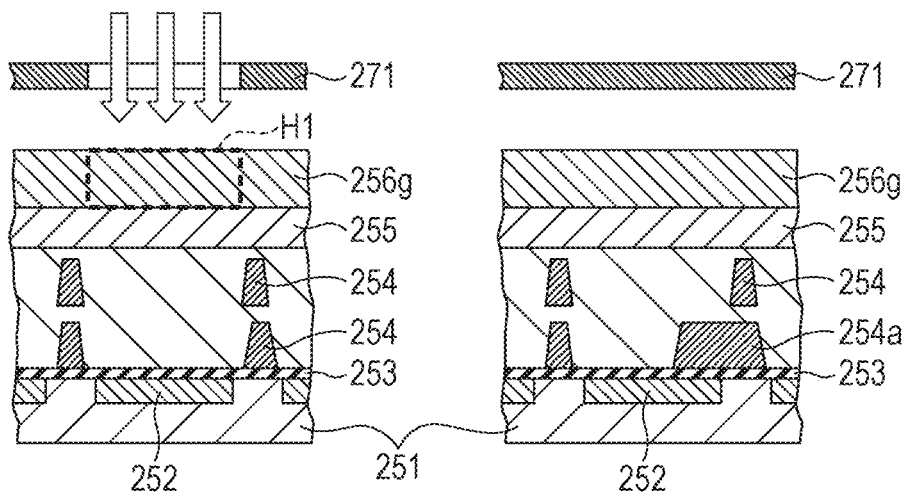
Figure 29:
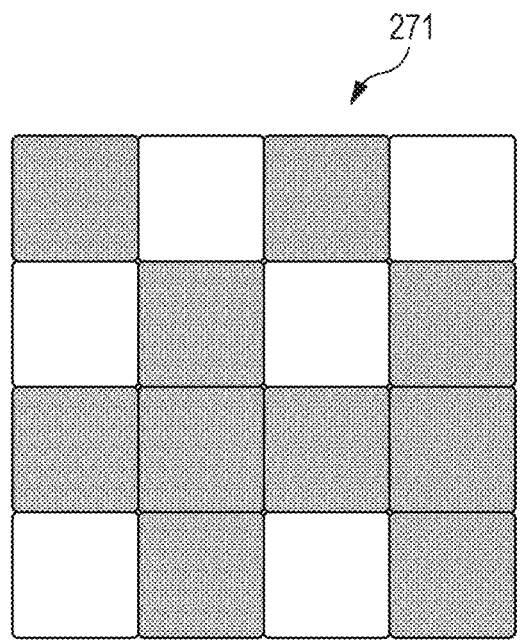
FIG. 29 is a diagram illustrating an exposure pattern of a reticle.

In Step S113, as shown in FIG. 27C, by using a reticle 271, the CF material 256*g* corresponding to the G pixel 31G is exposed to the light with the predetermined light exposure conditions (exposure amount, exposure illuminance, and the like). As shown in FIG. 29, the reticle 271 has an exposure pattern of exposing only the pixel area in which the G pixels 31G are formed (white parts in the drawing). Accordingly, as shown in FIG. 27C, an area H1 of the CF material 256*g* is only exposed to the light.

Figure 27D:
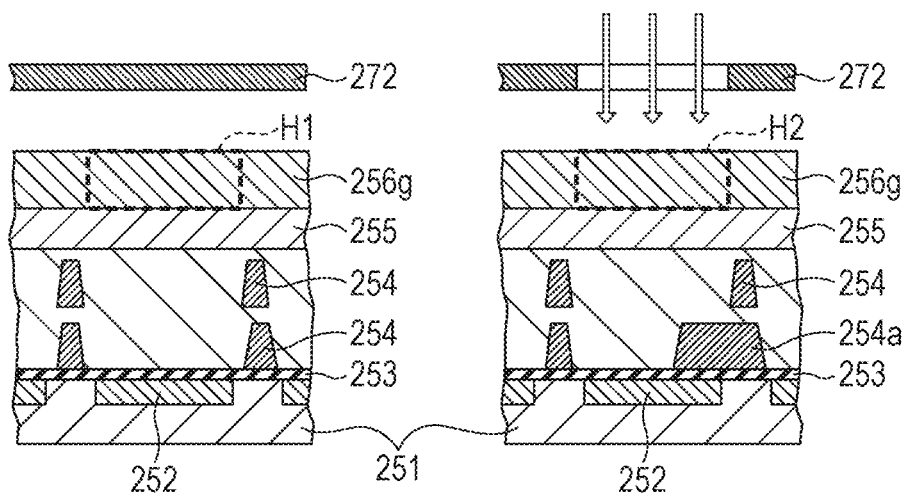
Figure 30:
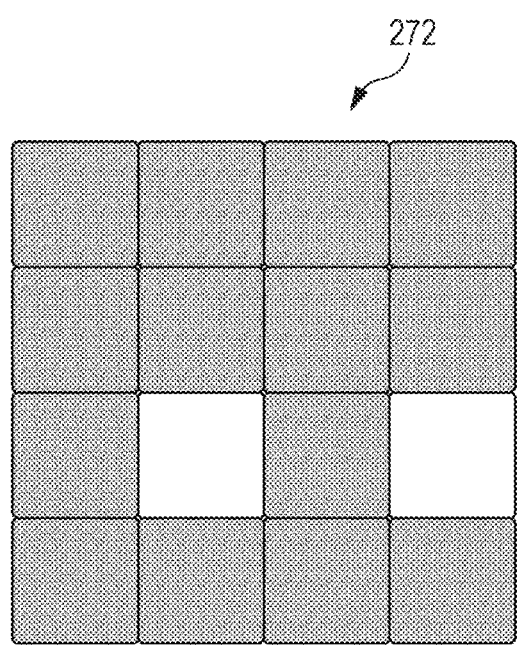
FIG. 30 is a diagram illustrating an exposure pattern of a reticle.

Next, in Step S114, as shown in FIG. 27D, by using a reticle 272, the CF material 256*g* corresponding to the phase difference detection pixel 32 is exposed to the light with the light exposure conditions different from the light exposure conditions in Step S113, specifically, with a smaller exposure amount, a lower exposure illuminance, and the like. As shown in FIG. 30, the reticle 272 has an exposure pattern of exposing only the pixel area in which the phase difference detection pixel 32 is formed (white parts in the drawing). Accordingly, as shown in FIG. 27D, an area H2 of the CF material 256*g* is only exposed to the light.

The process in Step S113 and the process in Step S114 are consecutively performed without interruption.

In Step S115, the CF material 256g is developed. Specifically, an area of the CF material 256g not exposed in Step S113 or Step S114 is removed by a developer. At that time, among the area of the CF material 256g exposed in Step S113 or Step S114, a film thickness of the area H2 is set to be smaller than the film thickness of the area H1.

Figure 28A:
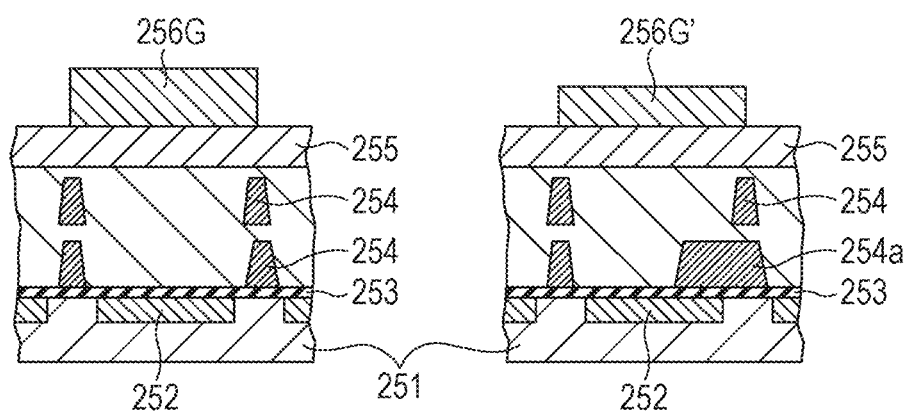
FIGS. 28A to 28C are diagrams illustrating a pixel formation step.

By doing so, as shown in FIG. 28A, the color filter 256G' included in the phase difference detection pixel 32 is formed to have a film thickness smaller than the film thickness of the color filter 256G included in the G pixel 31G.

In Step S116, a red CF material 256r (not shown) is applied on the flattening film 255.

In Step S117, although not shown, by using a reticle having an exposure pattern of exposing only the pixel area in which the R pixels 31R are formed, the CF material 256r corresponding to the R pixel 31R is exposed to the light with the predetermined light exposure conditions.

Figure 28B:
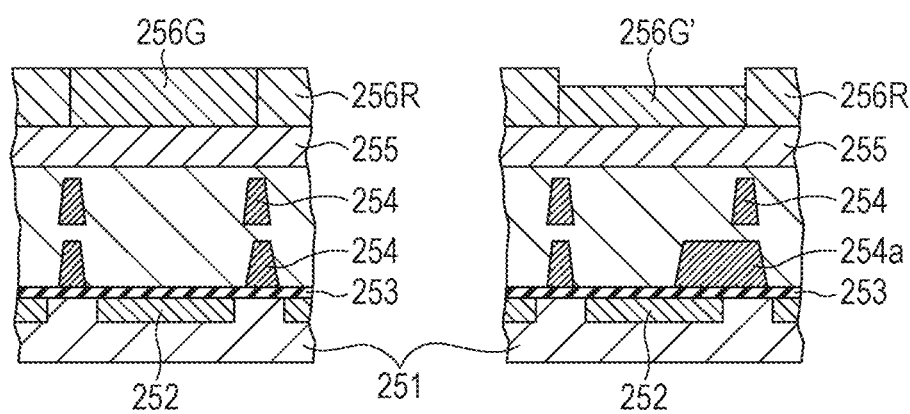

In Step S118, the CF material 256r is developed. Accordingly, as shown in FIG. 28B, the color filter 256R included in the R pixel 31R is formed. The film thickness of the color filter 256R is set to be the same as the film thickness of the color filter 256G included in the G pixel 31G.

In Step S119, a blue CF material 256b (not shown) is applied on the flattening film 255.

In Step S120, although not shown, by using a reticle having an exposure pattern of exposing only the pixel area in which the B pixels 31B are formed, the CF material 256b corresponding to the B pixel 31B is exposed to the light with the predetermined light exposure conditions.

In Step S121, the CF material 256b is developed. Accordingly, a color filter 256B (not shown) included in the B pixel 31B is formed. The film thickness of the color filter 256B is also set to be the same as the film thickness of the color filter 256G included in the G pixel 31G.

Figure 28C:
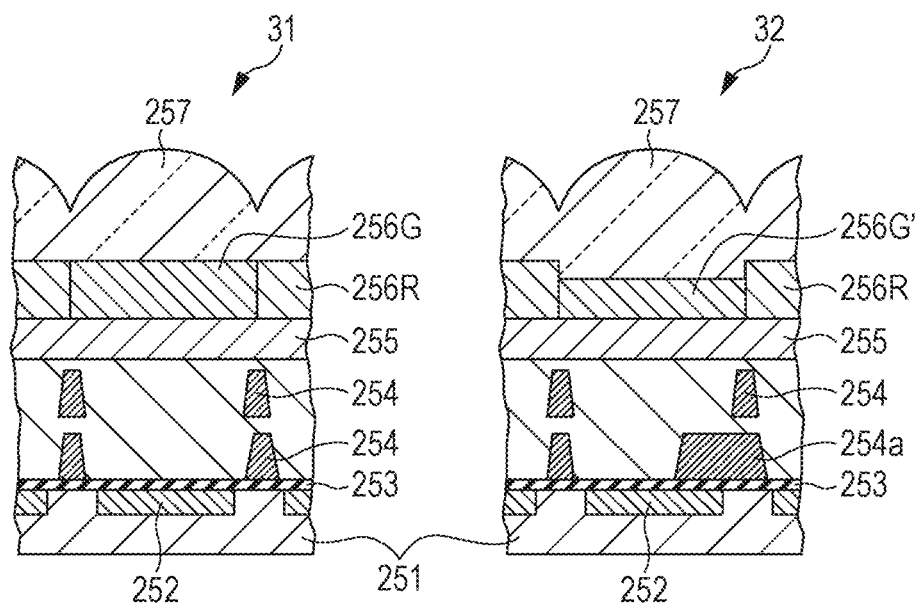

By doing so, after the color filter is formed for each pixel, the microlens 257 is formed for each pixel in Step S122, as shown in FIG. 28C. A microlens material is formed as a film by spin coating, and the microlens material is etched back through a photolithography step, and accordingly, the microlens 257 is formed.

By doing so, the imaging pixel 31 and the phase difference detection pixel 32 are formed.

According to the processes described above, since the color filter 256G' included in the phase difference detection pixel 32 is formed so as to have the film thickness to be smaller than the film thickness of the color filter 256G included in the G pixel 31G, it is possible to optimize the sensitivity of the imaging pixel and to suppress a decrease in the sensitivity of the phase difference detection pixel. That is, it is possible to optimize the sensitivity of the imaging pixel and the AF performance of the phase difference detection pixel.

In addition, since the process in Step S113 and the process in Step S114 are consecutively performed without interruption, when the flow of the coating, the exposure, and the development of the CF material is set as one step, it is possible to form the imaging pixel 31 and the phase difference detection pixel 32 in three steps which are the same as the general pixel formation process in which the R pixels, the G pixels, and the B pixels are arranged in a Bayer array, and it is possible to avoid an increase of the number of steps.

In the processes described above, the exposure of the pixel area in which the G pixel 31G is formed and the exposure of the pixel area in which the phase difference detection pixels 32 is formed are separately performed, but these may be collectively performed.

Other Example of Flow of Pixel Formation

Figure 31:
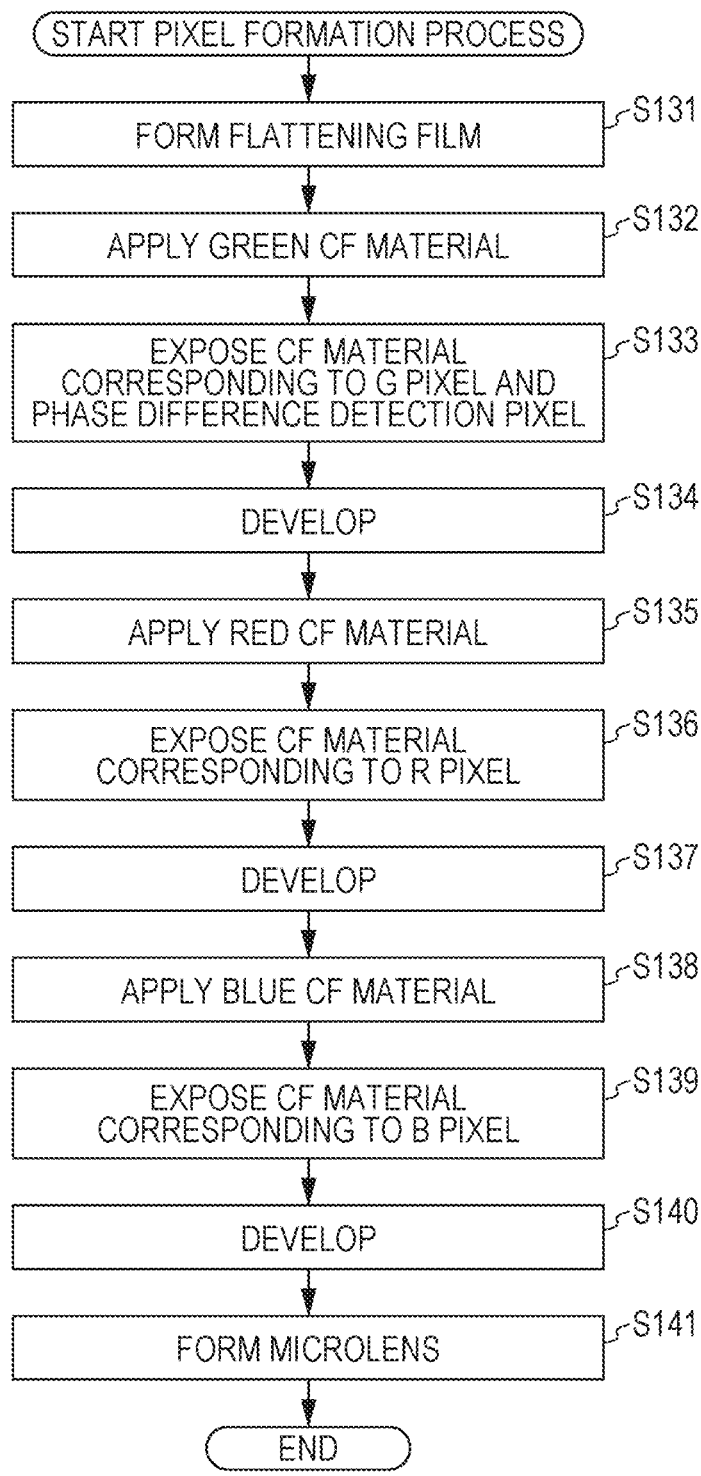
FIG. 31 is a flowchart illustrating a pixel formation process.

Herein, the other example of a flow of the pixel formation of the embodiment will be described with reference to FIGS. 31 to 32D. FIG. 31 is a flowchart illustrating a pixel formation process, and FIGS. 32A to 32D are cross-sectional views showing a pixel formation step.

Also, hereinafter, a process after the wire layer 254 is formed will be described.

Figure 32A:
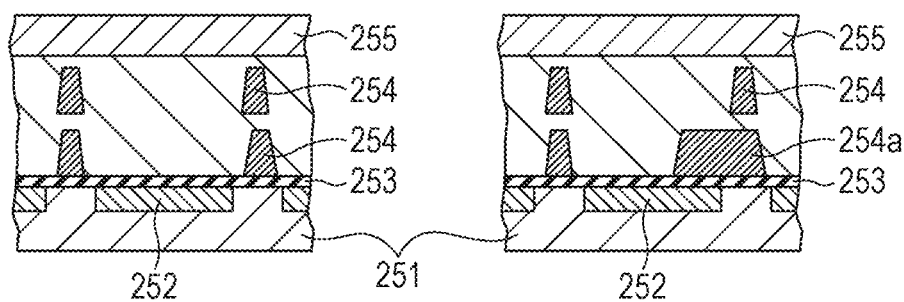
FIGS. 32A to 32D are diagrams illustrating a pixel formation step.

In Step S131, as shown in FIG. 32A, the flattening film 255 is formed on the wire layer 254.

Figure 32B:
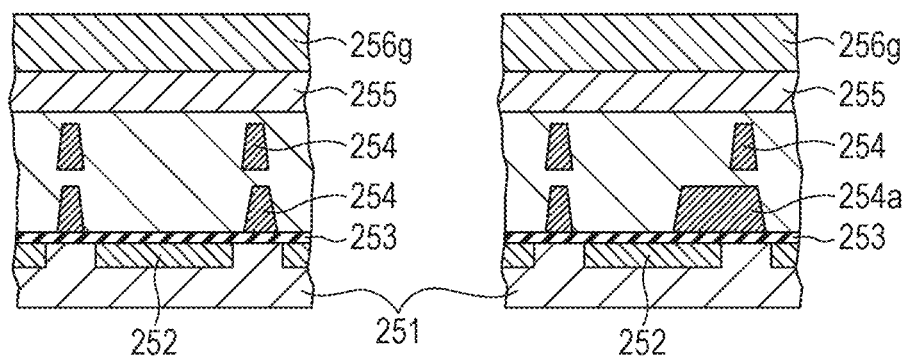

In Step S132, as shown in FIG. 32B, the CF material 256g is applied onto the flattening film 255.

Figure 32C:
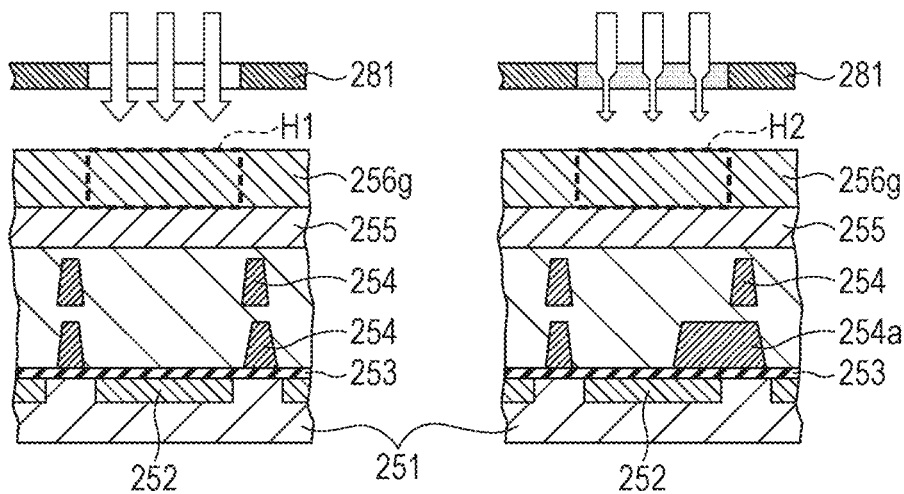
Figure 32D:
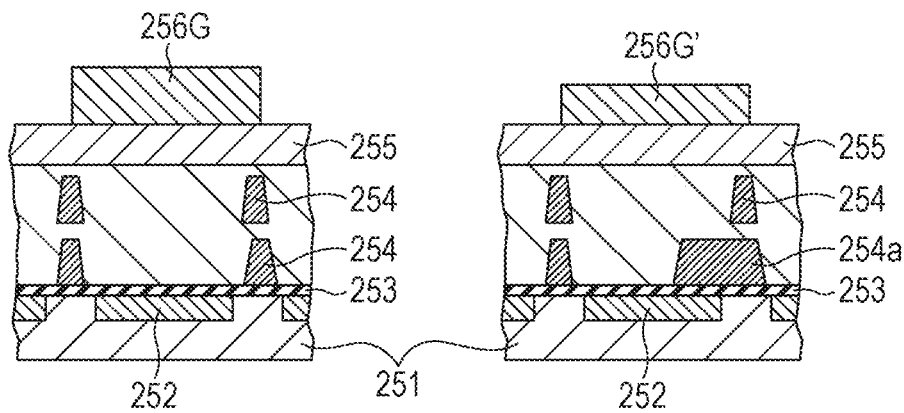
Figure 33:
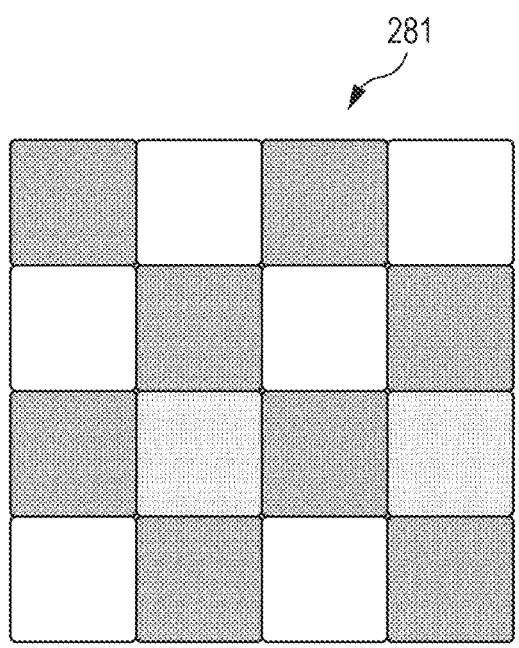
FIG. 33 is a diagram illustrating an exposure pattern of a gray scale mask.

In Step S133, as shown in FIG. 32C, by using a gray scale mask 281, the CF material 256g corresponding to the G pixel 31G and the phase difference detection pixel 32 is exposed to the light with the predetermined light exposure conditions (exposure amount, exposure illuminance, and the like). As shown in FIG. 33, the gray scale mask 281 has a first exposure pattern of exposing the pixel area in which the G pixels 31G are formed (white parts in the drawing), and a second exposure pattern of exposing the pixel area in which the phase difference detection pixels 32 are formed (light gray parts in the drawing). In the gray scale mask 281, the light transmittance of the second exposure pattern is set to be different from light transmittance of the first exposure pattern (specifically, to be lower than the light transmittance of the first exposure pattern). Accordingly, as shown in FIG. 32C, the area H2 of the CF material 256g is exposed to the light with smaller exposure amount and lower exposure illuminance than those of the area H1.

In Step S134, the CF material 256g is developed. Specifically, the area of the CF material 256g not exposed in Step S113 is removed by a developer. At that time, among the area of the CF material 256g exposed in Step S113, the film thickness of the area H2 is set to be smaller than the film thickness of the area H1.

By doing so, as shown in FIG. 32D, the color filter 256G' included in the phase difference detection pixel 32 is formed to have a film thickness smaller than the film thickness of the color filter 256G included in the G pixel 31G.

The processes in Step S135 and the subsequent steps are the same as the processes in Step S116 and the subsequent steps in the flowchart of FIG. 26, and therefore the description thereof will be omitted.

Also, according to the processes described above, since the color filter 256G' included in the phase difference detection pixel 32 is formed so as to have the film thickness to be smaller than the film thickness of the color filter 256G included in the G pixel 31G, it is possible to optimize the sensitivity of the imaging pixel and to suppress a decrease in the sensitivity of the phase difference detection pixel. That is, it is possible to optimize the sensitivity of the imaging pixel and the AF performance of the phase difference detection pixel.

Also, in the processes described above, it is possible to form the imaging pixel 31 and the phase difference detection pixel 32 in three steps which are the same as the general pixel formation process in which the R pixels, the G pixels, and the B pixels are arranged in a Bayer array, and it is possible to avoid an increase of the number of steps.

As described above, the configuration in which the present technology is applied to the surface irradiation type CMOS image sensor has been described, but hereinafter, a configuration in which the present technology is applied to the rear surface irradiation type CMOS image sensor will be described.

Configuration Example of Pixels of Seventh Embodiment

Figure 34:
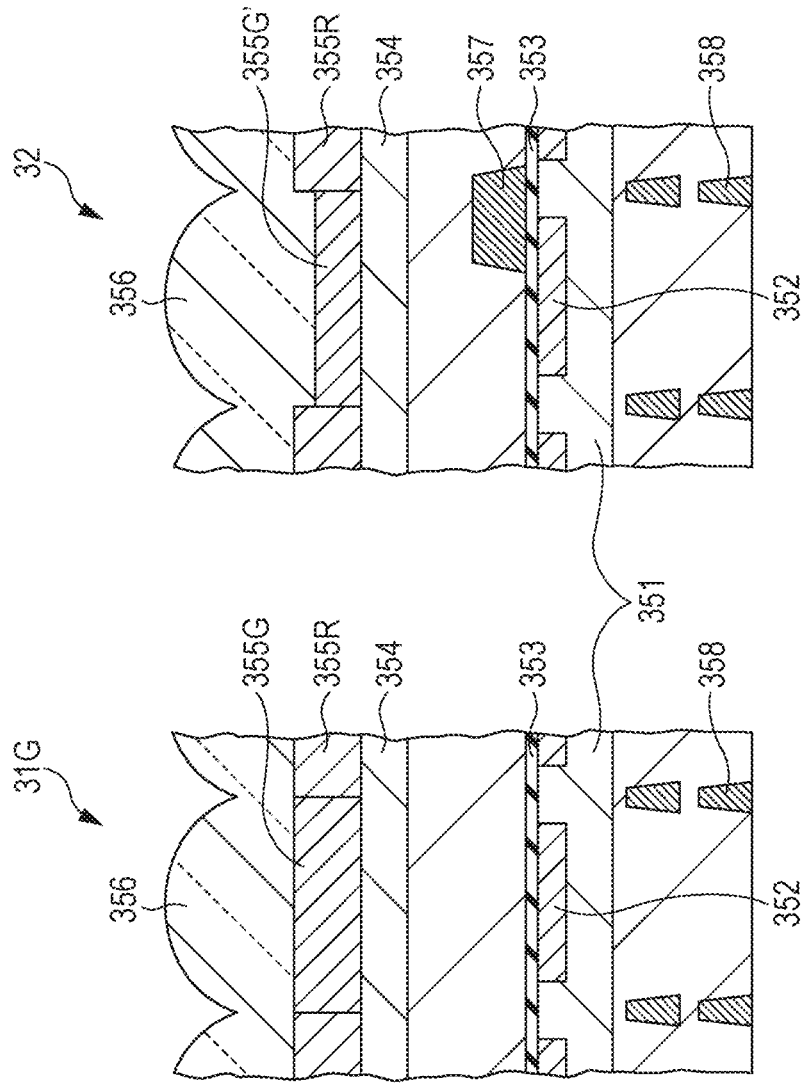
FIG. 34 is a cross-sectional view showing a configuration example of a pixel of a seventh embodiment of the present technology.

FIG. 34 is a cross-sectional view showing a configuration example of the pixels of the rear surface irradiation type CMOS image sensor 10 according to a seventh embodiment. FIG. 34 shows a cross-sectional view of the G pixel 31G among the imaging pixels 31, and the phase difference detection pixels 32 of the rear surface irradiation type CMOS image sensor 10.

As shown in FIG. 34, in the G pixel 31G, a photoelectric conversion unit 352 is formed on a semiconductor substrate 351 and an insulating layer 353 is formed on the upper layer of the semiconductor substrate 351.

A flattening film 354 is formed on the insulating layer 353, and a green color filter 355G having spectral characteristics corresponding to the G pixel 31G is formed on the flattening film 354. A microlens 356 is formed on the color filter 355G. Also, in the example of FIG. 34, since a red color filter 355R is formed on the same layer as the color filter 355G, the R pixel 31R is formed adjacent to the G pixel 31G.

Meanwhile, the semiconductor substrate 351, the photoelectric conversion unit 352, the insulating layer 353, and the microlens 356 are also formed in the phase difference detection pixel 32, in the same manner as the imaging pixel 31.

In the phase difference detection pixel 32, a light shielding film 357 is formed on the insulating layer 353 to have an opening having a size which is substantially half of a light receiving area of the photoelectric conversion unit 352. A color filter 355G' is formed on the same layer as the color filter 355G. The color filter 355G' is formed to have a film thickness smaller than that of the color filter 355G.

In the rear surface irradiation type CMOS image sensor 10, a wire layer 358 is formed on a surface opposite to the surface where the microlens 356 is formed.

Also, in the embodiment, since the color filter 355G' included in the phase difference detection pixel 32 is formed so as to have the film thickness to be smaller than the film thickness of the color filter 355G included in the G pixel 31G, it is possible to optimize the sensitivity of the imaging pixel and to suppress a decrease in the sensitivity of the phase difference detection pixel. That is, it is possible to optimize the sensitivity of the imaging pixel and the AF performance of the phase difference detection pixel.

Modification Example

As described above, the configuration in which some of the G pixels 31G among the R pixels 31R, the G pixels 31G, and the B pixels 31B as the imaging pixels 31 arranged along a Bayer array are substituted with the phase difference detection pixels 32, has been described, but some of the R pixels 31R or the B pixels 31B may be substituted with the phase difference detection pixels 32.

In this case, a color filter included in the phase difference detection pixel 32 is formed so as to have a film thickness to be smaller than a film thickness of a color filter 256R included in the R pixel 31R, or a color filter 256B included in the B pixel 31B.

Figure 35:
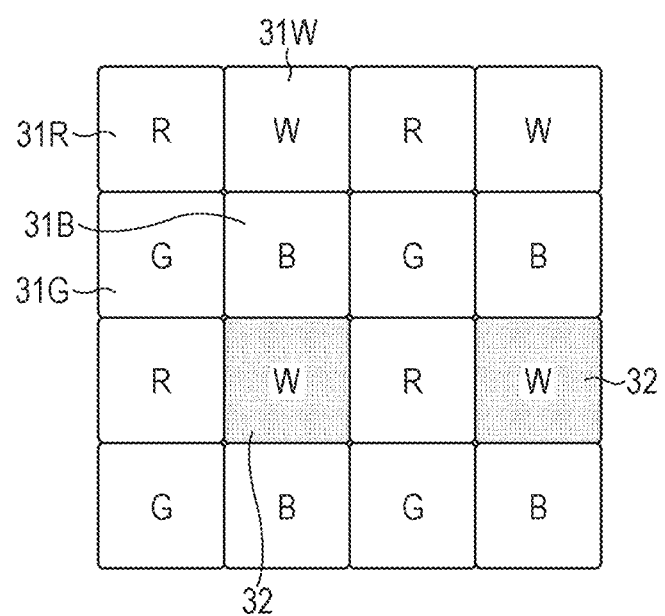
FIG. 35 is a diagram showing another example of a color filter.

As shown in FIG. 35, when white pixels (W pixels) 31W are arranged along a Bayer array as the imaging pixels 31, instead of the R pixels 31R, the G pixels 31G, and the B pixels 31B, some of the W pixels 31W may be substituted with the phase difference detection pixels 32. Since a color filter included in the W pixel 31W has a property of penetrating light in the entire visible light range, it is possible to improve the sensitivity of the phase difference detection pixels 32.

When some of the W pixels 31W are substituted with the phase difference detection pixels 32, the light intensity received by the phase difference detection pixels 32 may be excessively increased due to the property of the color filter included in the W pixel 31W, and light may be leaked to the imaging pixels 31 which are adjacent to the phase difference detection pixels 32.

When such a leakage of light is not allowed, some of the R pixels 31R, the G pixels 31G, or the B pixels 31B are substituted with the phase difference detection pixels 32, and thus, it is possible to decrease the leakage of light to the imaging pixel 31 which is adjacent to the phase difference detection pixels 32, by the property of only penetrating light with a specific color of the color filter included in the phase difference detection pixels 32.

The color of the color filter included in the phase difference detection pixels 32 is not limited to the same color of the R pixel, the G pixel, the B pixel, and the W pixel, and may be a color which is the same as any one color of the color filter included in the imaging pixel 31.

Configuration Example of Electronic Apparatus

Next, a configuration example of an electronic apparatus to which the present technology is applied will be described with reference to FIG. 36.

Figure 36:
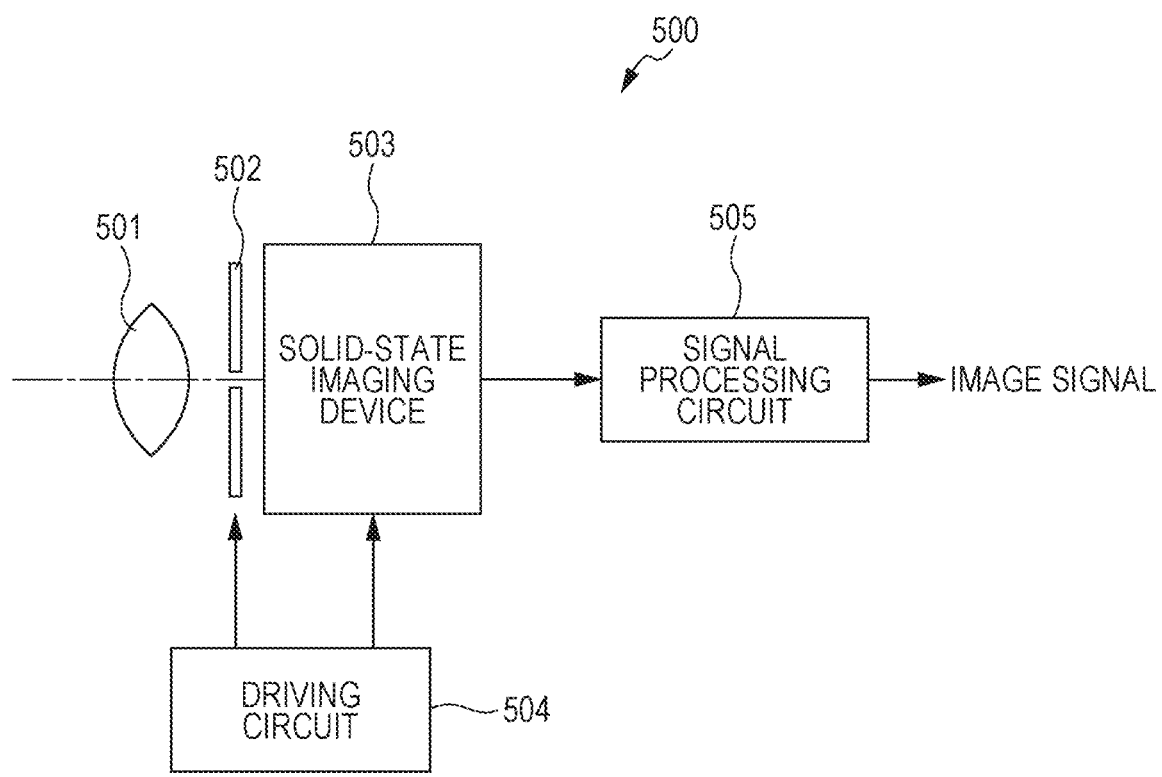
FIG. 36 is a block diagram showing a configuration example of an electronic apparatus to which the present technology is applied.

An electronic apparatus 500 shown in FIG. 36 includes an optical lens 501, a shutter device 502, a solid-state imaging device 503, a driving circuit 504, and a signal processing circuit 505. FIG. 36 shows a configuration in a case of providing the CMOS image sensor 10 including the pixels of the embodiments in the electronic apparatus (for example, a digital still camera), as the solid-state imaging device 503.

The optical lens 501 images image light (incident light) from a subject on an imaging surface of the solid-state imaging device 503. Accordingly, signal charges are accumulated in the solid-state imaging device 503 for a given time period. The shutter device 502 controls a light emission period and a light shielding period with respect to the solid-state imaging device 503.

The driving circuit 504 supplies a driving signal for controlling a signal transmission operation of the solid-state imaging device 503 and a shutter operation of the shutter device 502. The solid-state imaging device 503 performs signal transmission by the driving signal (timing signal) supplied from the driving circuit 504. The signal processing circuit 505 performs various signal processes with respect to the signal output from the solid-state imaging device 503. A moving image signal subjected to the signal process is stored in a storage medium such as a memory and is output to a monitor.

The electronic apparatus 500 includes a lens driving unit (not shown) which drives the optical lens 501 in an optical axis direction thereof. The lens driving unit configures a focus mechanism for performing focus adjustment, with the optical lens 501. In the electronic apparatus 500, various control operations such as a control operation of the focus mechanism or a control operation of the constituent elements described above are performed by a system controller (not shown).

Regarding the control operation of the focus mechanism, an arithmetic process of calculating a deviation direction and a deviated amount of the focus is, for example, performed in the signal processing circuit 505, based on a focus detection signal output from the phase difference detection pixel of the solid-state imaging device of the present technology. By receiving this arithmetic result, the system controller performs the focus control operation of moving the optical lens 501 in the optical axis direction thereof through the lens driving unit to set the focused state.

According to the electronic apparatus 500 of the embodiment of the present technology, it is possible to optimize the sensitivity of the imaging pixel and the AF performance of the phase difference detection pixel in the solid-state imaging device 503, and as a result, image quality is improved.

The embodiments of the present technology are not limited to the embodiments described above, and various modifications can be performed within a range not departing from a scope of the present technology.

The present technology can be configured as follows.

(1) A solid-state imaging device including:
an imaging pixel including a photoelectric conversion unit which receives incident light; and
a phase difference detection pixel including the photoelectric conversion unit and a light shielding unit which shields some of the light incident to the photoelectric conversion unit,
in which the imaging pixel further includes a high refractive index film which is formed on the upper side of the photoelectric conversion unit, and
the phase difference detection pixel further includes a low refractive index film which is formed on the upper side of the photoelectric conversion unit.

(2) The solid-state imaging device according to (1),
in which the imaging pixel and the phase difference detection pixel include color filter layers which are respectively formed on upper layers of the high refractive index film and the low refractive index film, and
the high refractive index film and the low refractive index film function as a flattening film.

(3) The solid-state imaging device according to (2),
in which the low refractive index film is formed to cover the high refractive index film and functions as the flattening film.

(4) The solid-state imaging device according to (2),
in which the high refractive index film is formed to cover the low refractive index film and functions as the flattening film.

(5) The solid-state imaging device according to any one of (1) to (4),
in which a refractive index of the high refractive index film is higher than a refractive index of the low refractive index film, by a value equal to or greater than 0.1.

(6) The solid-state imaging device according to (5),
in which the refractive index of the high refractive index film is set as a value from 1.5 to 2.0.

(7) The solid-state imaging device according to (5),
in which the refractive index of the low refractive index film is set as a value from 1.1 to 1.5.

(8) The solid-state imaging device according to any one of (1) to (7),
in which any one or both of the high refractive index film and the low refractive index film are formed of a material having a photosensitive property.

(9) The solid-state imaging device according to any one of (1) to (8),
in which the high refractive index film or the low refractive index film is formed to have a cross-sectional shape as a shape of a convex lens.

(10) The solid-state imaging device according to any one of (1) to (9),
in which the imaging pixel and the phase difference detection pixel include microlenses on the upper side of the color filter layers, and
the microlenses are formed in the same manner, in the imaging pixel and the phase difference detection pixel.

(11) A manufacturing method of a solid-state imaging device which includes an imaging pixel including a photoelectric conversion unit which receives incident light, and a phase difference detection pixel including the photoelectric conversion unit and a light shielding unit which shields some of the light incident to the photoelectric conversion unit, the method including:
forming a high refractive index film on the upper side of the photoelectric conversion unit in the imaging pixel; and
forming a low refractive index film on the upper side of the photoelectric conversion unit in the phase difference detection pixel.

(12) An electronic apparatus including:
a solid-state imaging device including
an imaging pixel including a photoelectric conversion unit which receives incident light, and
a phase difference detection pixel including the photoelectric conversion unit and a light shielding unit which shields some of the light incident to the photoelectric conversion unit,
in which the imaging pixel further includes a high refractive index film which is formed on the upper side of the photoelectric conversion unit, and
the phase difference detection pixel further includes a low refractive index film which is formed on the upper side of the photoelectric conversion unit.

In addition to the configuration described above, the present technology can be configured as follows.

(1) A solid-state imaging device including:
an imaging pixel including a photoelectric conversion unit which receives incident light and a color filter which is formed on the upper side of the photoelectric conversion unit; and
a phase difference detection pixel including the photoelectric conversion unit, the color filter, and a light shielding unit which shields some of the light incident to the photoelectric conversion unit,
in which the color filter included in the phase difference detection pixel is formed so as to have a film thickness to be smaller than a film thickness of the color filter included in the imaging pixel.

(2) The solid-state imaging device according to (1),
in which the color filter included in the phase difference detection pixel is formed as a color filter with the same color as one of colors of the color filter included in the imaging pixel.

(3) The solid-state imaging device according to (2),
in which the color filter included in the phase difference detection pixel is formed as any one of a red color filter, a green color filter, and a blue color filter.

(4) The solid-state imaging device according to (2),
in which the color filter included in the phase difference detection pixel is formed as a white color filter.

(5) A manufacturing method of a solid-state imaging device which includes an imaging pixel including a photoelectric conversion unit which receives incident light and a color filter which is formed on the upper side of the photoelectric conversion unit, and a phase difference detection pixel including the photoelectric conversion unit, the color filter, and a light shielding unit which shields some of the light incident to the photoelectric conversion unit, the method including:

forming the color filter included in the phase difference detection pixel so as to have a film thickness to be smaller than a film thickness of the color filter included in the imaging pixel.

(6) The manufacturing method of a solid-state imaging device according to (5) further including:

exposing a color filter material by using a first reticle having a first exposure pattern of exposing an area in which the imaging pixel is formed; and exposing the color filter material with the light exposure conditions different from the case of using the first reticle, by using a second reticle having a second exposure pattern of exposing an area in which the phase difference detection pixel is formed.

(7) The manufacturing method of a solid-state imaging device according to (5) further including:

exposing the color filter material by using a gray scale mask having a first exposure pattern of exposing an area in which the imaging pixel is formed, and a second exposure pattern of exposing an area in which the phase difference detection pixel is formed and having light transmittance different from that of the first exposure pattern.

(8) An electronic apparatus including:
a solid-state imaging device including
an imaging pixel including a photoelectric conversion unit which receives incident light and a color filter which is formed on the upper side of the photoelectric conversion unit; and
a phase difference detection pixel including the photoelectric conversion unit, the color filter, and a light shielding unit which shields some of the light incident to the photoelectric conversion unit,
in which the color filter included in the phase difference detection pixel is formed so as to have a film thickness to be smaller than a film thickness of the color filter included in the imaging pixel.

It should be understood by those skilled in the art that various modifications, combinations, sub-combinations and alterations may occur depending on design requirements and other factors insofar as they are within the scope of the appended claims or the equivalents thereof.

What is claimed is:
1. An imaging device comprising:
an imaging pixel including a first photoelectric conversion unit that receives incident light;
a phase difference detection pixel including a second photoelectric conversion unit that receives incident light;
a light shielding member that shields the photoelectric conversion unit of the phase difference detection pixel from some light incident on the phase difference detection pixel;
a flattening film formed on an upper side of the imaging pixel, the phase difference detection pixel, and light shielding member; and
a color filter layer formed on an upper side of the flattening film,
wherein the color filter layer includes a first color filter located on the first photoelectric conversion unit and a second color filter located on the second photoelectric conversion unit, and
wherein the second color filter is thinner than the first color filter based on a sensitivity of the phase difference detection pixel.

2. The imaging device according to claim 1, wherein the imaging pixel further includes a refractive index film that is formed on an upper side of the first photoelectric conversion unit.

3. The imaging device according to claim 2, wherein the phase difference detection pixel further includes a low refractive index film that is formed on an upper side of the second photoelectric conversion unit, wherein the low refractive index film has a lower refractive index than the refractive index film.

4. The imaging device according to claim 3, wherein a refractive index of the refractive index film is higher than a refractive index of the low refractive index film, by a value equal to or greater than 0.1.

5. The imaging device according to claim 3, wherein the refractive index of the refractive index film is set as a value from 1.5 to 2.0.

6. The imaging device according to claim 3, wherein the refractive index of the low refractive index film is set as a value from 1.1 to 1.5.

7. The imaging device according to claim 3, wherein any one or both of the refractive index film and the low refractive index film are formed of a material having a photosensitive property.

8. The imaging device according to claim 3, wherein the refractive index film or the low refractive index film is formed to have a cross-sectional shape as a shape of a convex lens.

9. The solid-state imaging device according to claim 3, wherein the imaging pixel and the phase difference detection pixel include microlenses on an upper side of the color filter layer, and
the microlenses are formed in the same manner, in the imaging pixel and the phase difference detection pixel.

10. The imaging device according to claim 2, wherein the flattening film is formed to cover the refractive index film.

11. The imaging device according to claim 1, wherein the sensitivity of the phase difference detection pixel is lower than a sensitivity of the imaging pixel.

12. The imaging device according to claim 11, wherein the flattening film is a low refractive index film having a refractive index of 1.1 to 1.5.

13. The imaging device according to claim 1, wherein a pixel of a first color is the phase difference detection pixel, and wherein the imaging pixel is of the first color.

* * * * *